United States Patent
Magoon et al.

(10) Patent No.: US 7,256,573 B2
(45) Date of Patent: Aug. 14, 2007

(54) DISTRIBUTED ACTIVE TRANSFORMER POWER CONTROL TECHIQUES

(75) Inventors: Rahul Magoon, Irvine, CA (US); Scott Kee, Pasadena, CA (US); Ichiro Aoki, Arcadia, CA (US); Frank Carr, Newport Coast, CA (US); Hui Wu, Pasadena, CA (US); Jerry Twomey, Escondido, CA (US); Seyed-Ali Hajimiri, Pasadena, CA (US)

(73) Assignee: Axiom Microdevices, Inc., Irvine, CA (US)

( * ) Notice: Subject to any disclaimer, the term of this patent is extended or adjusted under 35 U.S.C. 154(b) by 0 days.

(21) Appl. No.: 11/095,231

(22) Filed: Mar. 31, 2005

(65) Prior Publication Data

US 2006/0017538 A1     Jan. 26, 2006

Related U.S. Application Data

(60) Provisional application No. 60/558,179, filed on Mar. 31, 2004.

(51) Int. Cl.
    *G01R 27/02*     (2006.01)
(52) U.S. Cl. ............ 324/95; 324/117 R; 324/127
(58) Field of Classification Search ............ None
    See application file for complete search history.

(56) References Cited

U.S. PATENT DOCUMENTS

| | | | |
|---|---|---|---|
| 3,835,379 A * | 9/1974 | Templin | .............. 324/630 |
| 5,781,071 A | 7/1998 | Kusunoki | |
| 5,986,500 A | 11/1999 | Park et al. | |
| 6,816,012 B2 * | 11/2004 | Aoki et al. | .............. 330/276 |
| 6,842,068 B2 | 1/2005 | Takahashi et al. | |
| 6,856,199 B2 * | 2/2005 | Komijani et al. | .......... 330/276 |
| 6,889,034 B1 | 5/2005 | Dent | |
| 7,068,104 B2 | 6/2006 | Burns et al. | |
| 2002/0135422 A1 | 9/2002 | Aoki et al. | |
| 2003/0156003 A1 | 8/2003 | Sortor | |

FOREIGN PATENT DOCUMENTS

WO    WO 03/079547 A2    9/2003

OTHER PUBLICATIONS

International Search Report for PCT/US2005/010602, dated Aug. 26, 2005.

\* cited by examiner

*Primary Examiner*—Minh N. Tang
(74) *Attorney, Agent, or Firm*—Jackson Walker L.L.P.; Christopher J. Rourk

(57) ABSTRACT

A distributed active transformer on a semiconducting substrate is provided. The distributed active transformer includes an outer primary, a secondary disposed adjacent to the outer primary, and an inner primary disposed adjacent to the outer primary and the secondary. A plurality of first three terminal devices is coupled to the outer primary at a plurality of locations. A plurality of second three terminal devices coupled to the inner primary at a plurality of locations, and each second three terminal device is disposed opposite from and coupled to one of the plurality of first three terminal devices. A plurality of power control actuation circuits is also provided, where each power control actuation circuit is coupled to one of the first three terminal devices and the second three terminal devices.

20 Claims, 18 Drawing Sheets

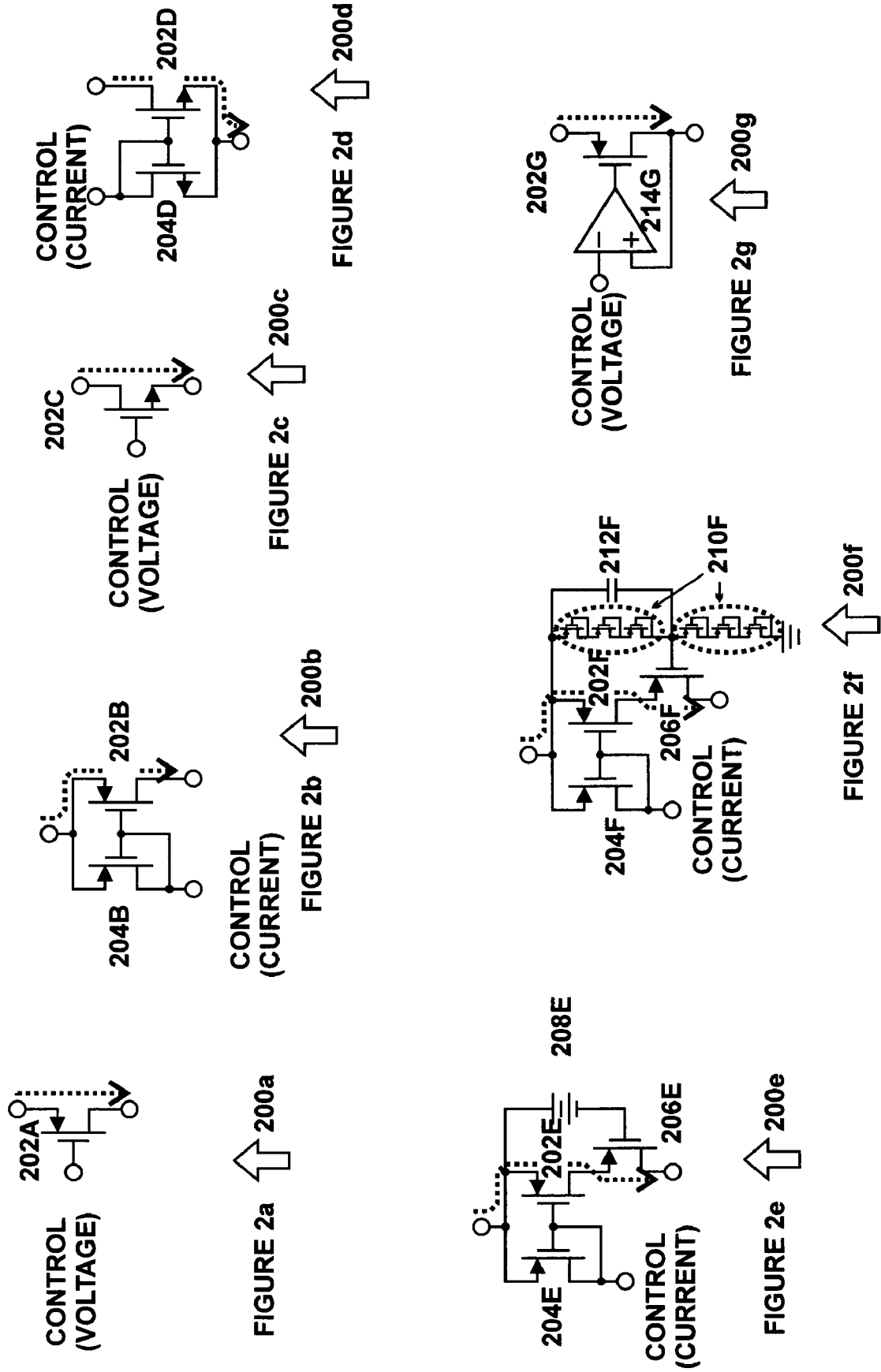

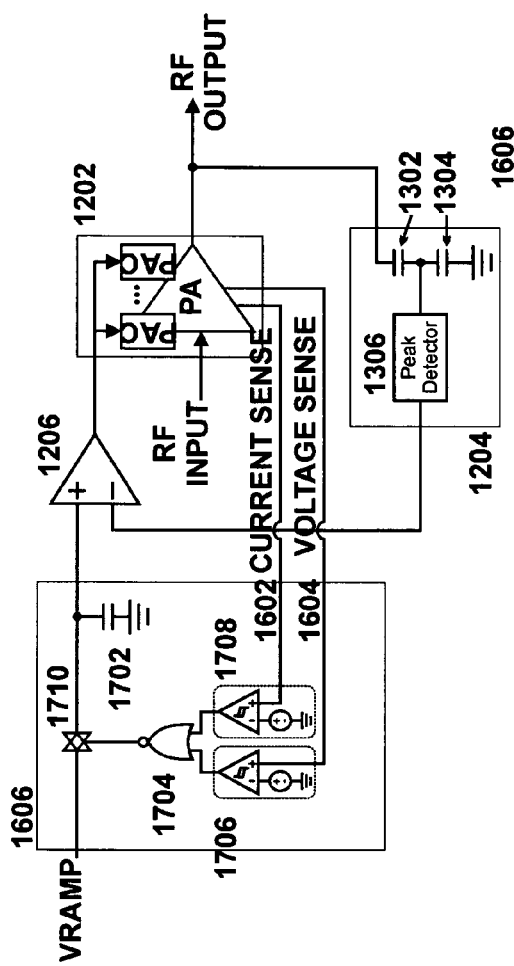
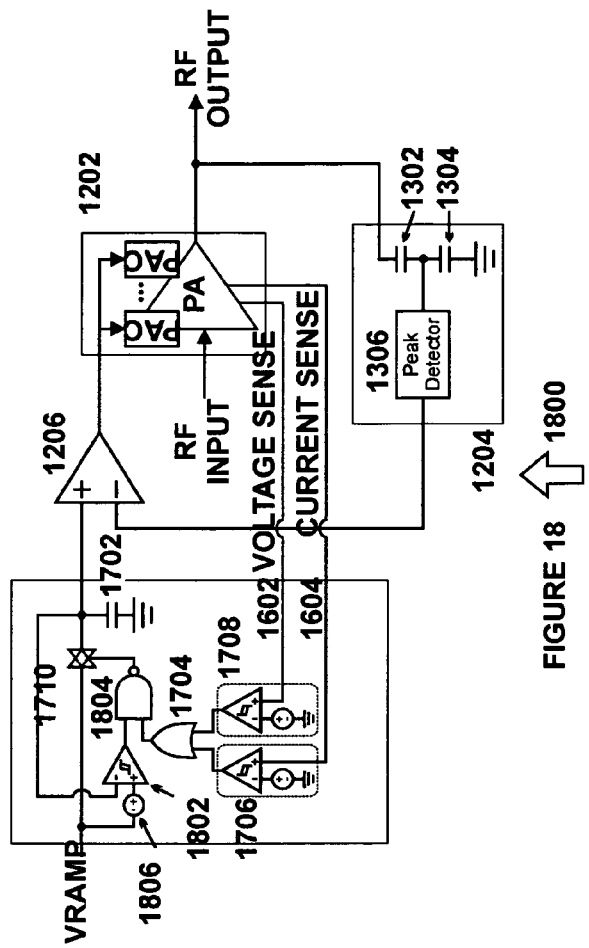
FIGURE 17 1700
FIGURE 18 1800

DISTRIBUTED ACTIVE TRANSFORMER POWER CONTROL TECHIQUES

RELATED APPLICATIONS

This application claims priority to U.S. Provisional application 60/558,179, filed Mar. 31, 2004, which is hereby incorporated by reference for all purposes.

FIELD OF THE INVENTION

The present invention relates to distributed active transformers (DATs), and more specifically to power control actuation circuits for DATs that provides advantages for DAT operation.

BACKGROUND

Power control is required in most power amplifier applications. This is typically accomplished through the use of power control actuation circuits between the power supply and the power amplifier core, such as a two level push-pull P and N amplifier configuration. For different power levels, the top and bottom amplifying entities will experience different dc and ac signal levels as a function of the power control voltage. These ac and dc signal levels must be carefully controlled to avoid potentially damaging voltage levels.

By adjusting the voltage drop across the power control actuation circuits, the power supply voltage to the power amplifier core can be varied accordingly. While the power control actuation circuits can be provided with a low on-resistance to reduce the power loss on it, such devices are typically large and use more surface area of an integrated circuit. Large device size can results in a large parasitic capacitance, which can also result in a higher substrate loss if there is also a large voltage swing and high frequency on the power control actuation circuits node. Large device size can also induce undesirable harmonic distortion, among other things.

SUMMARY OF THE INVENTION

In accordance with the present invention, power supply circuitry for a DAT is provided that overcomes known problems with power control actuation circuits.

In particular, power control actuation circuits for a DAT is provided that does not require large devices and that also minimizes the on resistance of the power control actuation circuits.

In accordance with an exemplary embodiment of the present invention, a DAT on a semiconducting substrate is provided. The DAT includes an outer primary, a secondary disposed adjacent to the outer primary, and an inner primary disposed adjacent to the outer primary and the secondary. A plurality of first three terminal devices is coupled to the outer primary at a plurality of locations. A plurality of second three terminal devices coupled to the inner primary at a plurality of locations, and each second three terminal device is disposed opposite from and coupled to one of the plurality of first three terminal devices. A plurality of power control actuation circuits is also provided, where each power control actuation circuit is coupled to one of the first three terminal devices and the second three terminal devices.

The present invention provides many important technical advantages. One important technical advantage of the present invention is a DAT with decreased operating loss and improved voltage breakdown performance.

Those skilled in the art will further appreciate the advantages and superior features of the invention together with other important aspects thereof on reading the detailed description that follows in conjunction with the drawings.

BRIEF DESCRIPTION OF THE DRAWINGS

FIGS. 2a through 2g are diagrams of power control actuation circuits in accordance with exemplary embodiments of the present invention;

FIG. 17 is a diagram of VSWR protection circuit in accordance with an exemplary embodiment of the present invention;

FIG. 18 is a diagram of VSWR protection circuit with Vramp holding release circuitry in accordance with an exemplary embodiment of the present invention;

DETAILED DESCRIPTION OF PREFERRED EMBODIMENTS

Figure 1:
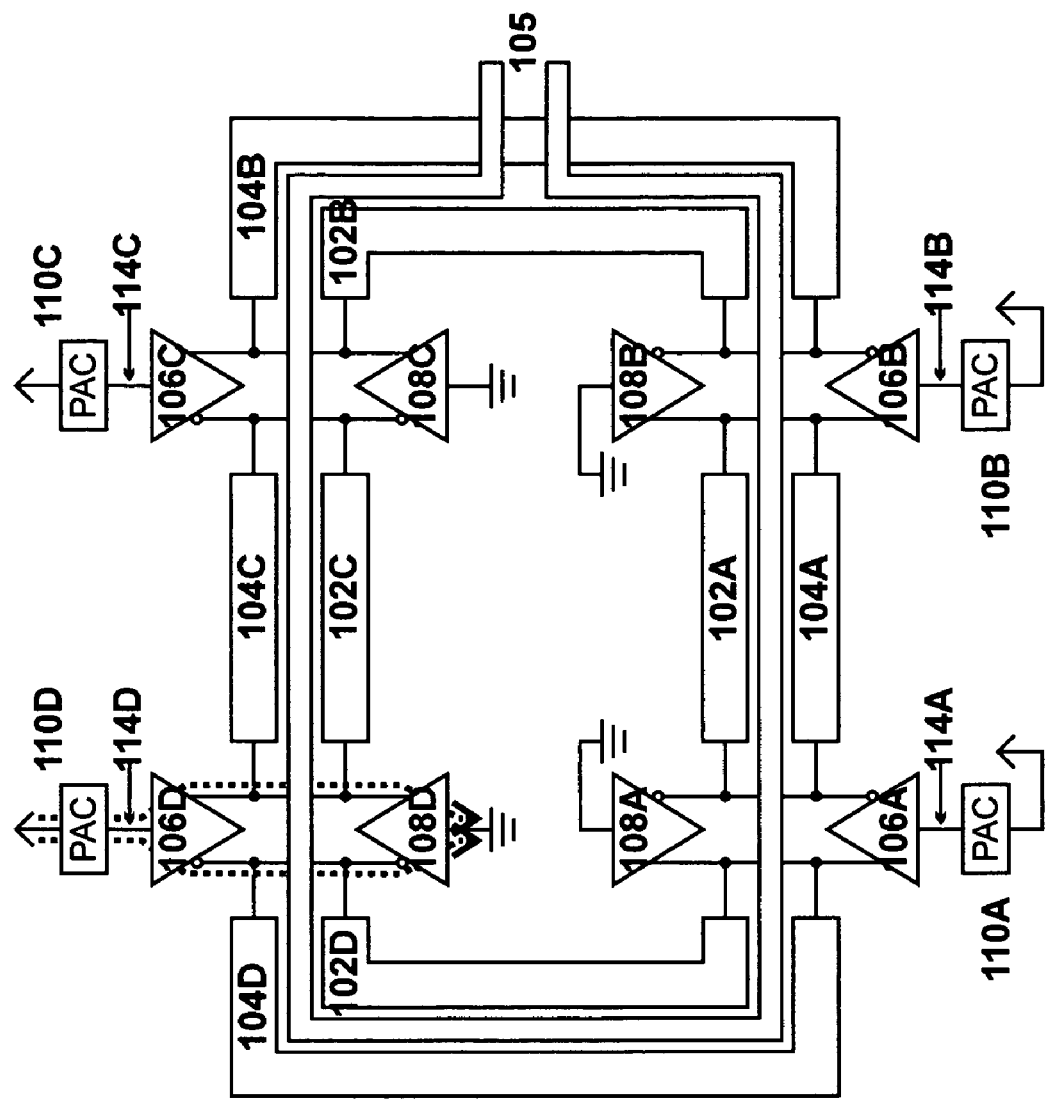
FIG. 1 is a diagram of a DAT with power control actuation circuits in accordance with an exemplary embodiment of the present invention.

In the description that follows, like parts are marked throughout the specification and drawings with the same reference numerals, respectively. The drawing figures might not be to scale, and certain components can be shown in generalized or schematic form and identified by commercial designations in the interest of clarity and conciseness.

When "top" or other relative directional connotation is used in this context, it refers to the relative location of the power control actuation circuits in the dc current path from Vdd to dc ground. This directional notation should be treated separately from "inner" and "outer" notations which typically refer to the relative placement with regard to a DAT secondary. Generally, the choice of connecting a circuit to the "inner" or the "outer" primary can be treated as an independent decision as to whether the circuit should be connected to the "top" part of the supply or the "bottom".

FIG. 1 is a diagram of a DAT 100 with power control actuation circuits in accordance with an exemplary embodiment of the present invention. DAT 100 includes an inner primary winding 102 with inner primary winding segments 102a through 102d, an outer primary winding 104 with outer primary winding segments 104a through 104d, and a secondary winding 105 placed so as to be magnetically coupled to both primary windings. Each inductive element can be a slab having a rectangular shape, a trapezoidal shape, a stepped structure, a curved structure, or other suitable structures. Likewise, each inductive element can be identical to the other inductive elements, can match opposite inductive elements, can be different from each other inductive element, or other suitable configurations of winding inductive elements can be used, including but not limited to two or more integer numbers of inductive elements and a corresponding number of drivers. Inner primary winding 102 is driven by amplifying entities 108a through 108d, and outer primary winding 104 is driven by amplifying entities 106a through 106d so that the inductive elements of the DAT can act as a power combiner.

DAT 100 includes power control actuation circuits 110a through 110d, which can be implemented as transistors, three terminal devices, other suitable devices or suitable combinations of devices. Power control actuation circuits 110a through hod controls the power provided to amplifying entities 106a through 106d and 108a through 108d, minimizes the power control actuation circuit on-resistance with large low-on-resistance devices, minimizes the distance from the power control actuation circuits to the amplifying entities and power supply, minimizes the voltage swing or bounce on the power control actuation circuitry node to reduce the substrate loss, and minimizes the voltage stress on the power control actuation circuits to improve breakdown performance.

Exemplary DAT 100 is shown with inner primary winding segments 102a through 102d and outer primary winding segments 104a through 104d, which are driven by amplifying entities 108a through 108d and 106a through 106d, respectively, to provide power output to the secondary winding 105.

In this configuration, amplifying entities 106a through 106d and 108a through 108d are connected in series with respect to the voltage source and dc ground and drive their respective primaries in parallel with an alternating current. The outputs of amplifying entities 106a through 106d and 108a through 108d are coupled to each other at the ends of the corresponding inner primary winding segments 102a through 102d and outer primary winding segments 104a through 104d, such that the ac signals received by the inner primary winding segments 102a through 102d are the same as the ac signals received by the corresponding outer primary winding segments 104a through 104d, and are each driven by both sets of amplifying entities 106a through 106d and 108a through 108d simultaneously. The dc current, however, conducts through amplifying entities 106a through 106d through the connections between the primary segments, and then to dc ground through amplifying entities 108a through 108d. An exemplary dc current path is indicated by the dashed lines indicating the current flow through amplifying entities 106d and 108d. This configuration allows amplifying entities 106a through 106d and 108a through 108d to have operating voltages that are lower than if the two groups of amplifying entities were each independently fed from the voltage supply.

The exemplary dc current path supplying the amplifying entities includes power control actuation circuits 110a through 110d, such that each of the amplifying entities 106a through 106d has a corresponding power control actuation circuit 110a through 110d, respectively, between its supply port and the external supply voltage. Power control actuation circuits 110a through 110d control the power delivered to the secondary winding 105 by controlling the current through amplifying entities 106a through 106d and 108a through 108d. For instance, if the amplifying entities are operated as saturated power amplifying circuits, the output signals they each provide at their outputs can be approximately linearly related to the supply current they each consume. By controlling the current, the output levels can thereby be modulated. Since the output at secondary winding 105 is determined by the outputs the amplifying entities deliver to inner primary winding segments 102a through 102d and outer primary winding segments 104a through 104d, the total output power can be controlled. Alternately, power control actuation circuits 110a through 110d can regulate the voltages at their outputs, nodes 114a through 114d, respectively, since there typically also exists a nearly linear relationship between the supply voltage that a saturated amplifier receives and the output that it generates.

A reduction in output power is typically accompanied by a reduction of the dc voltage at nodes 114a through 114d and a correspondingly larger voltage drop across power control actuation circuits 110a through 110d, regardless of whether control is accomplished by changing the voltage or the current. Thus, at high power, the voltage drop across power control actuation circuits 110a through 110d may only be a small fraction of the total supply voltage, but at low power levels the largest component of the dc supply voltage drop occurs across power control actuation circuits 110a through 110d.

Using a top-connected, distributed power control topology allows power control actuation circuits 110a through 110d to be connected to Vdd in dc, which allows them to be easily controlled using a signal referred to dc ground, such as if a PMOS pass device is used. Likewise, power control actuation circuits 110a through 110d can be placed close to amplifying entities 106a through 106d, so as to generate lower dc loss that would otherwise be generated from current flow through metal routing such as might occur if a single larger device were used. Additionally, if amplifying entities 108a through 108d are implemented so as to require only bias points which are relative to their respective dc grounds, this power control architecture can allow the power to be reduced to the point where the dc voltage drop across the supply to dc ground is nearly zero while still being able to generate appropriate bias voltages directly from the supply voltage.

FIG. 2a is a diagram of a power control actuation circuit 200a in accordance with an exemplary embodiment of the present invention. A control voltage applied to the gate of pass transistor 202a regulates the current that is conducted to the an amplifying entity, as depicted by the dashed arrow.

FIG. 2b is a diagram of a power control actuation circuit 200b in accordance with an exemplary embodiment of the present invention. In this configuration, the gate voltage for pass transistor 202b is provided by the diode-connected transistor 204b onto which the control signal is applied as a current. If transistors 204b and 202b are identical, except for an optional scaling multiple, the two transistors will operate as a current mirror. In this manner, the current passing through the power control actuation circuit is a linear function of the control signal, which allows a constant loop gain to be kept if the power control actuation circuit is utilized in a closed-loop system where the output power is measured and the control current is changed to regulate it. In an open loop system, linearization makes the transfer function from control signal to output level more linear and helps to minimize changes due to process variation.

FIGS. 2c and 2d are diagrams of NMOS power control actuation circuits 200c and 200d in accordance with exemplary embodiments of the present invention. NMOS power control actuation circuits 200c and 200d function in the same manner as power control actuation circuits 200a and 200b, respectively, except that the PMOS transistors of power control actuation circuits 200a and 200b are replaced by NMOS transistors 202c, 202d, and 204d.

FIG. 2e is a diagram of a power control actuation circuit 200e in accordance with an exemplary embodiment of the present invention. Transistors 204e and 202e operate in the same manner as transistors 202b and 204b, and cascade transistor 206e placed in series with pass transistor 202e is supplied with a gate voltage from bias voltage 208e. In this circuit, pass transistor 202e controls the current, while transistor 206e increase the output resistance and the breakdown voltage of power control actuation circuit 200e. Increasing the output resistance has the benefit of making the accuracy of the output current relative to the control signal as well as making it less variant due to manufacturing process variations. The increase in breakdown voltage can be important if the supply voltage can be higher than the allowable voltage across a single transistor device. Since the power control actuation circuit may be required to drop the bulk of the supply voltage when low output power is required, it is necessary to utilize some combination of devices between the supply and the output which can withstand the entire supply voltage. By using a cascade configuration, each transistor 202e and 206e is required to drop only part of the total voltage dropped by the power control actuation circuit. By stacking enough devices, larger supply voltages can be supported.

FIG. 2f is a diagram of a power control actuation circuit 200f in accordance with an exemplary embodiment of the present invention. Series diodes 210f are used to supply the bias voltage, and are configured so that each device operates in a sub-threshold region, so that the bias current for all of the diodes is held low to minimize power loss and leakage current. Additionally, capacitor 212f is used to filter ac signals that might otherwise corrupt the gate voltage of transistor 206f. This capacitor can be especially important due to the high impedance of the sub-threshold diodes, which may cause high frequency currents to develop at the gate.

FIG. 2g is a diagram of a power control actuation circuit 200g in accordance with an exemplary embodiment of the present invention. Pass transistor 202g is driven by error amplifier 214g which controls the output voltage of the associated power control actuation circuit, to be the same as that of the control signal. This has the advantage of making the transfer function from control voltage to output voltage more linear and vary less over process when it is desired to regulate the output voltage of the power control as opposed to the output current.

Figure 3C:
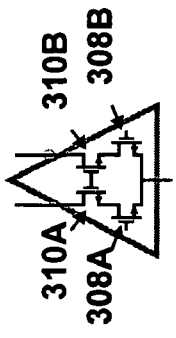
FIGS. 3a through 3e are diagrams of amplifying entities in accordance with exemplary embodiments of the present invention.
Figure 3E:
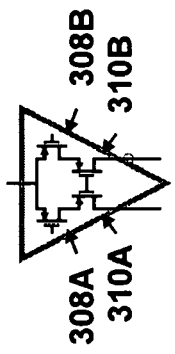
Figure 3B:
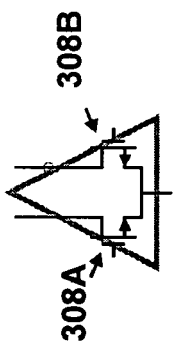
Figure 3D:
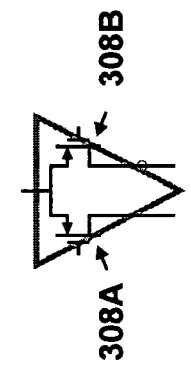
Figure 3A:
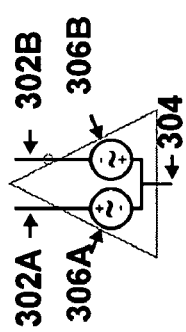

FIG. 3a is a diagram of amplifying entity 300a in accordance with an exemplary embodiment of the present invention. Amplifying entity 300a can produce at least two output nodes 302a and 302b, where the phase of the voltage produced at node 302b is substantially 180° out of phase with respect to the voltage produced at node 302a. Amplifying entity 300a can be represented by signal sources 306a and 306b which are connected to outputs 302a and 302b, respectively, so that the generated signals are substantially out of phase with each other and typically of substantially equal amplitude. Furthermore, signal sources 306a and 306b have an additional terminal 304 which is the common point relative to which the two output signals are generated. This node can be used to conduct dc current to amplifying entity 300a.

FIG. 3b is a diagram of amplifying entity 300b with complementary outputs in accordance with an exemplary embodiment of the present invention. In this circuit, NMOS transistors 308a and 308b can be driven with control inputs (i.e., signals applied to the MOSFET gates) which are substantially 180° out of phase, thereby producing output voltages (i.e. outputs from the MOSFET drains) which are similarly out of phase.

FIG. 3c is a diagram of amplifying entity 300c in accordance with an exemplary embodiment of the present invention. Amplifying entity 300c uses a differential cascode amplifier with NMOS transistors 310a and 310b, which have a common gate connection coupled to NMOS transistors 308a and 308b, each of which can be a MOSFET as depicted or other suitable transistors. In operation, the common gate voltage of transistors 310 can be provided a bias voltage, while transistors 308 can be provided complementary drive signals representing the signal to be amplified. The cascode amplifier can allow the use of a higher supply voltage compared to the supply voltage that a non-cascode amplifier using the same transistors can withstand. Furthermore, a cascode amplifier can typically produce a higher power gain than a non-cascode amplifier using the same transistors.

FIGS. 3*d* and 3*e* are exemplary amplifying entities 300*d* and 300*e* using PMOS transistors in accordance with an exemplary embodiment of the present invention. Amplifying entity 300*d* utilizes a configuration similar to that of amplifying entity 300*b*, and amplifying entity 300*e* utilizes a configuration similar to that of amplifying entity 300*c*, with PMOS transistors replacing the NMOS transistors in both embodiments.

Figure 4:
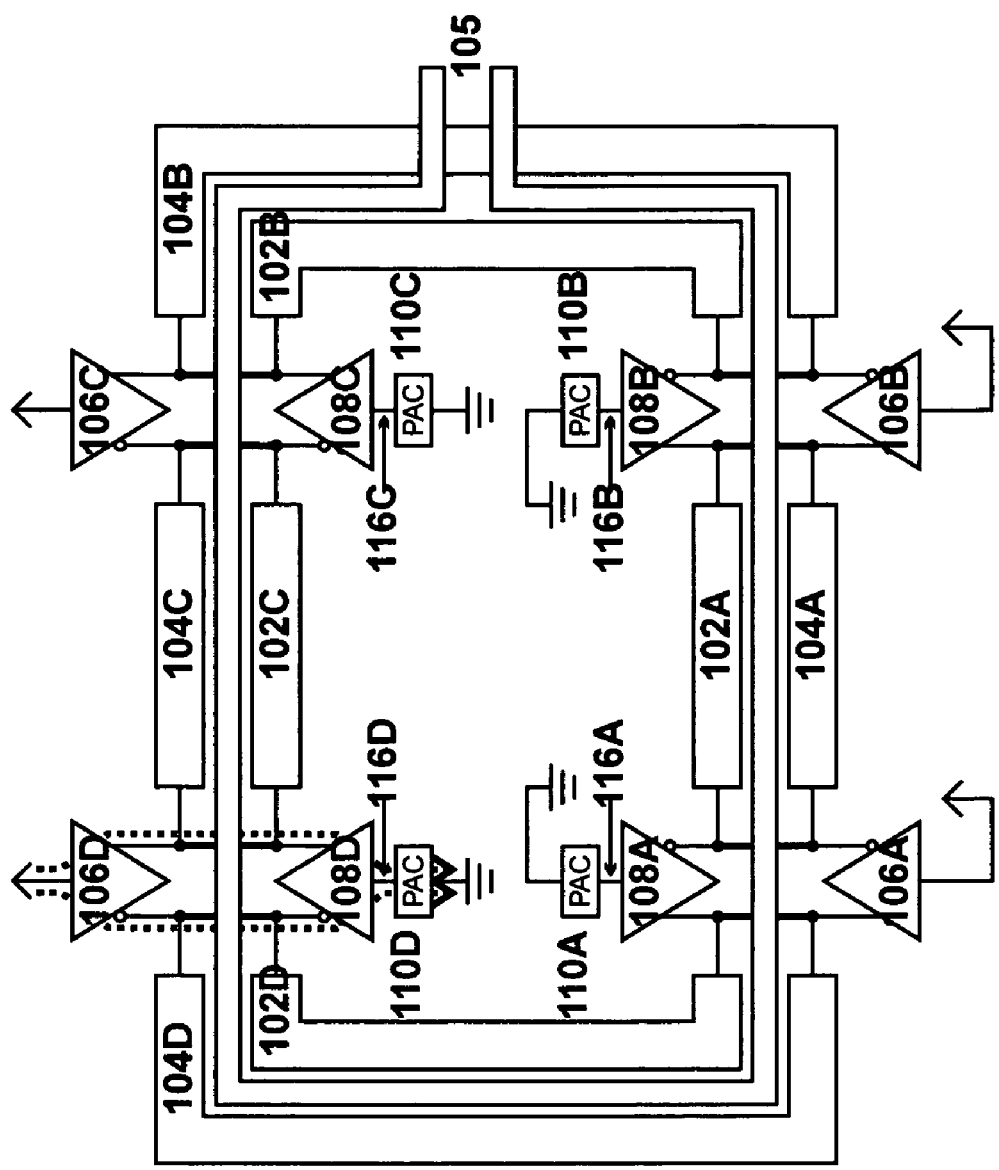
FIG. 4 is a diagram of DAT with power control actuation circuits in accordance with an exemplary embodiment of the present invention.

FIG. 4 is a diagram of DAT 400 with power control actuation circuitry in accordance with an exemplary embodiment of the present invention. DAT 400 utilizes a similar topology as that of DAT 100 but using a "bottom" power control actuation circuitry topology. In this configuration, amplifying entities 106*a* through 106*d* and 108*a* through 108*d* have the same supply sharing features as DAT 100, with amplifying entities 106*a* through 106*d* and 108*a* through 108*d* driving the primaries in parallel while taking supply current in series. Power control actuation circuits 110*a* through 110*d* are placed in the dc current path between amplifying entities 108*a* and 108*d* and the common voltage. This arrangement can be operated from a higher supply voltage than either of the two sets of amplifying entities 106*a* through 106*d* and 108*a* through 108*d* are capable of operating from individually.

In this configuration, the power delivered to the secondary winding 105 can be controlled using power control actuation circuits 110*a* through 110*d*, such as by controlling the current delivered to them or by controlling the voltage on nodes 116*a* through 116*d*. Generally speaking, whether it is the voltage or current that is controlled, reduction in output power is typically accompanied by an increase of the dc voltage at nodes 116*a* through 116*d*, and a correspondingly larger voltage drop across power control actuation circuits 110*a* through 110*d*. Thus, at high power levels the voltage drop across power control actuation circuits 110*a* through 110*d* can drop only a small fraction of the total supply voltage, but at low power levels the power control actuation circuits can drop the bulk of the dc supply voltage so that the voltage at nodes 116*a* through 116*d* is very close to the supply voltage.

In this implementation, power control actuation circuits 110*a* through 110*d* are connected to dc ground, and additional benefits can be obtained from using N-type transistors as power control actuation circuits 110*a* through 110*d*, since the necessary control voltage to drive an N-type pass transistor device would typically be a voltage between the supply and dc ground voltages in this configuration. By contrast, DAT 100 would typically require control voltages greater than the supply voltage for efficient operation if N-type devices were to be used for the pass transistor. Since N-type transistors can have smaller parasitic capacitance and lower on-resistance than comparable P-type transistors in typical silicon process technology, the efficiency can be increased and loss can be lowered in the power control actuation circuits at higher power levels.

DAT 400 thus allows power control actuation circuits 110*a* through 110*d* to be controlled using a signal that is referenced to the dc ground, can be laid out in a distributed manner, and if amplifying entities 106*a* through 106*d* are implemented so as to require only bias points that are negative relative to their respective supplies, DAT 400 allows the power to be reduced to the point where the dc voltage drop across amplifying entities 106*a* through 106*d* is nearly zero while still being able to generate appropriate bias voltage directly from the dc ground.

Figure 5:
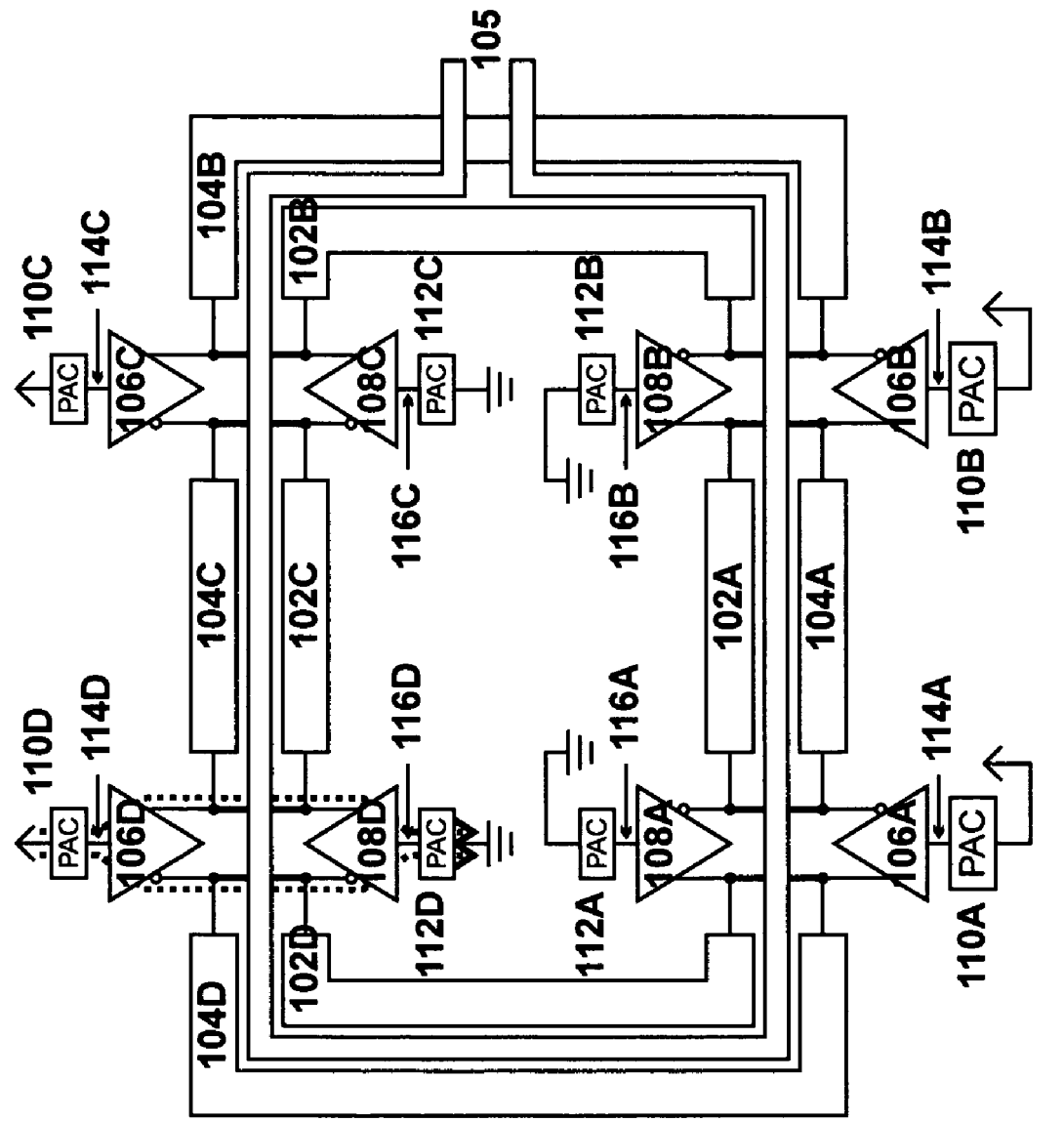
FIG. 5 is a diagram of DAT with power control actuation circuits in accordance with an exemplary embodiment of the present invention

FIG. 5 is a diagram of DAT 500 with power control actuation circuits 110*a* through 110*d* and 112*a* through 112*d* in accordance with an exemplary embodiment of the present invention. DAT 500 utilizes a similar topology as that of DAT 100 but includes "top" power control actuation circuits 110*a* through 110*d* and "bottom" power control actuation circuits 112*a* through 112*d*. In this configuration, amplifying entities 106*a* through 106*d* and 108*a* through 108*d* have the same supply sharing features as DAT 100 and drive the primaries in parallel while taking supply current in series. Power control actuation circuits 110*a* through 110*d* are placed in the dc current path between the supply voltage and amplifying entities 106*a* through 106*d*, while power control actuation circuits 112*a* through 112*d* are placed in the dc current path between amplifying entities 108*a* through 108*d* and dc ground. This configuration allows amplifying entities 106*a* through 106*d* and 108*a* through 108*d* to be operated from a higher supply voltage than either of the two is capable of operating from individually.

In this configuration, the output power delivered to the secondary winding 105 can be controlled using power control actuation circuits 110*a* through 110*d* and 112*a* through 112*d*, such as by controlling the current through the power control actuation circuits or by controlling the voltage on nodes 114*a* through 114*d* and 116*a* through 116*d*, respectively. As previously noted, a reduction in output power is typically accompanied by an increase of the dc voltage at nodes 116*a* through 116*d* and/or a reduction of the dc voltage at nodes 114*a* through 114*d*, and a correspondingly larger voltage drop across power control actuation circuits 110*a* through 110*d*, power control actuation circuits 112*a* through 112*d*, or a combination of the two. Thus, at high power levels, the power control actuation circuits together may drop only a small fraction of the total supply voltage, but at lower power levels, the power control actuation circuits may drop the bulk of the dc supply voltage such that the voltage at nodes 114*a* through 114*d* and 116*a* through 116*d* are nearly the same as each other.

In this implementation, connecting power control actuation circuits 112*a* through 112*d* to dc ground allows N-type transistors to be used as power control actuation circuits 112*a* through 112*d*. As N-type transistors have smaller parasitic capacitances and lower on-resistance than comparable P-type transistors in typical silicon process technology, the power losses and transistor area for these components can be reduced. DAT 500 further allows power control actuation circuits to be controlled using signals referenced to the dc ground, and can be laid out in a distributed manner.

In one embodiment, if power control actuation circuits 110*a* through 110*d* and 112*a* through 112*d* can be controlled so that each drops a similar dc voltage as the other at any given output power level, amplifying entities 106*a* through 106*d* and 108*a* through 108*d* can each be provided with simple bias circuits to provide appropriate bias at all power levels. In this embodiment, amplifying entities 106*a* through 106*d* are implemented so as to require only bias points which are negative relative to their common terminals connected to nodes 114*a* through 114*d*, such as if these amplifying entities are implemented using PMOS devices. Similarly, amplifying entities 108*a* through 108*d* can be implemented so as to require only bias points which are positive relative to their common terminals connected to nodes 116*a* through 116*d*, such as by implementing these amplifying entities using NMOS devices. In this way, each amplifying entity can generate bias voltages up to half the supply voltage at all power levels.

Figure 6A:
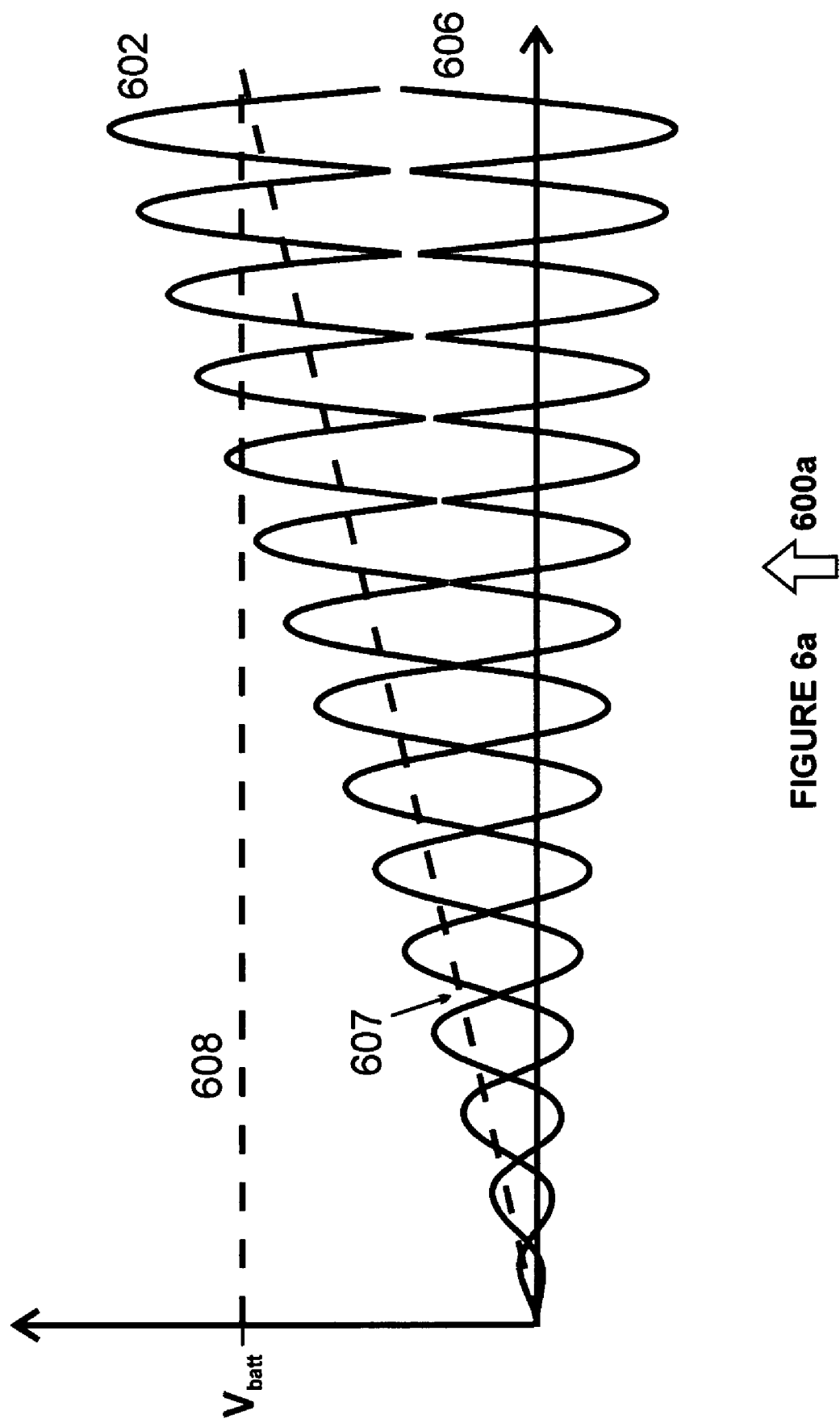
FIGS. 6A, 6B and 6C are representative voltage waveforms in accordance with an exemplary embodiment of the present invention.
Figure 6B:
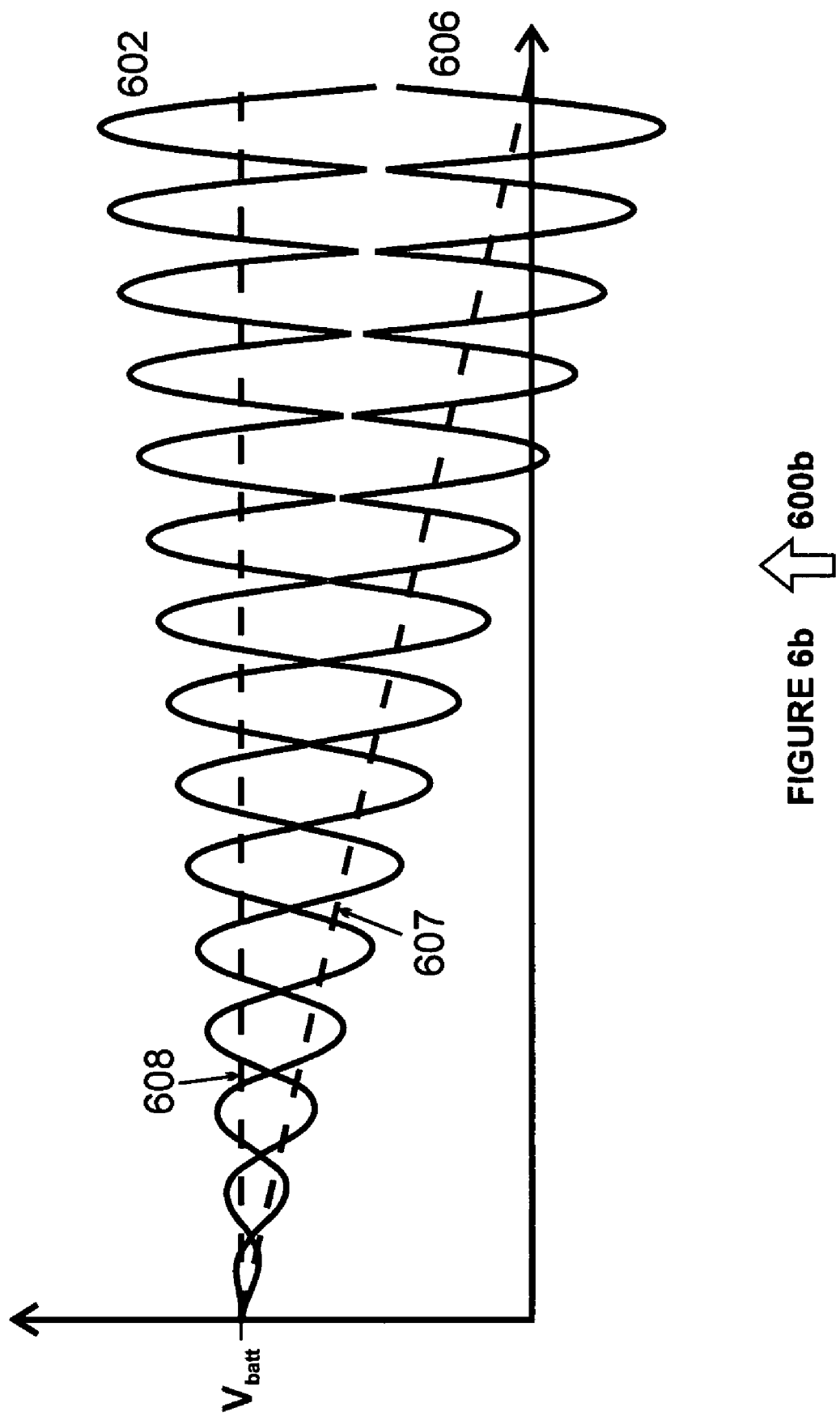
Figure 6C:
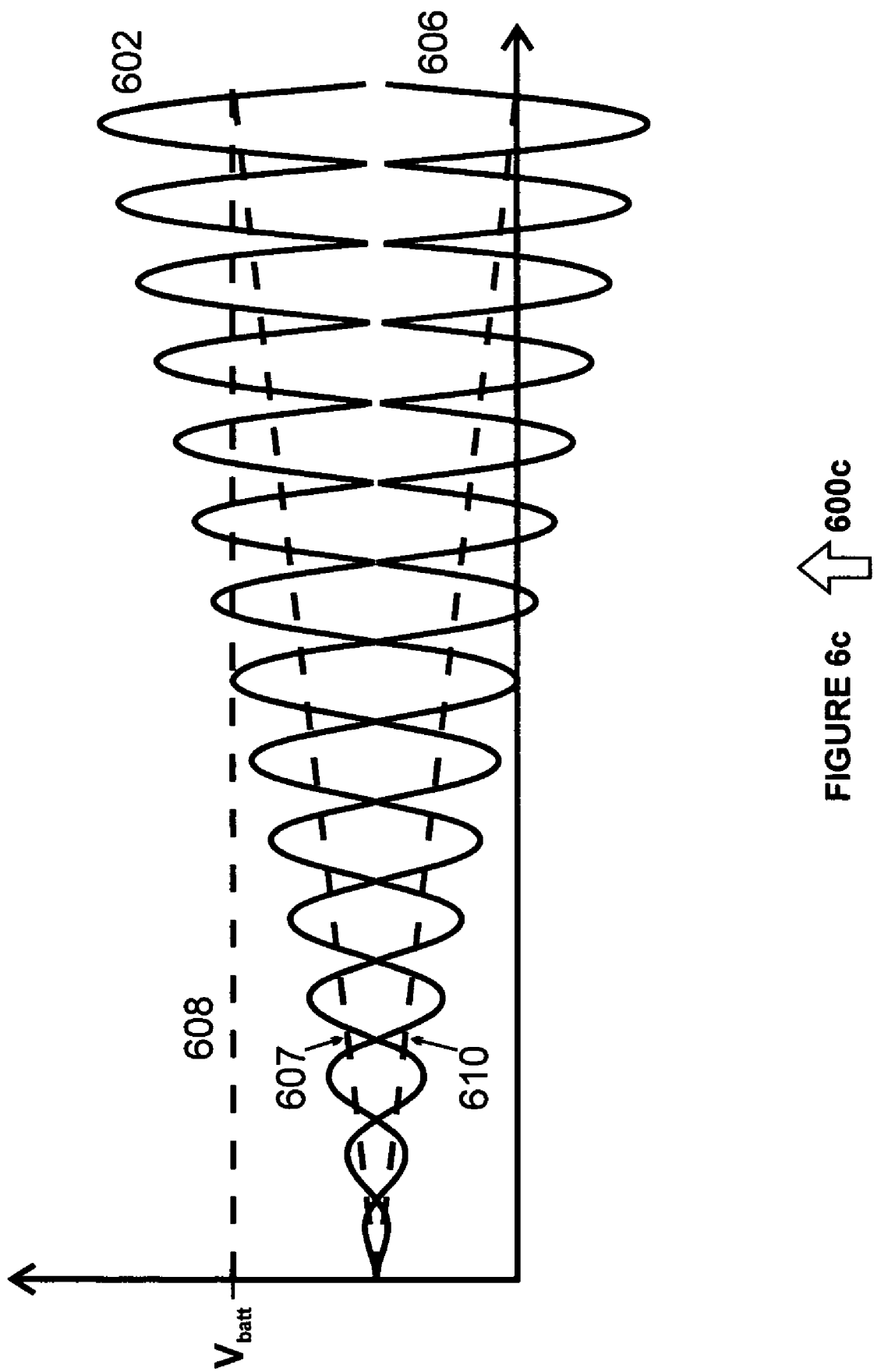

FIGS. 6A, 6B and 6C are representative voltage waveforms 600*a*, 600*b* and 600*c* in accordance with an exemplary embodiment of the present invention. Voltage waveform 600*a* represents a time-domain voltage typical of a fast power ramp from low power to high power in accordance with a "top" power control configuration such as implemented in DAT 100. Waveforms for the amplifying entity common nodes 114*a* through 114*d* of DAT 100 and its dc voltage are depicted by 602 and 607, respectively, in waveform 600*a*. The dc voltage drop across the power control actuation circuits is the difference between the dc voltage of the supply, depicted as dashed line 607, and dc voltage 608 in waveform 600*a*. The ac difference between 606 and 602 can be typically dropped together by power control actuation circuits 110*a* through 110*d* and supply connection inductance such as bond wires. Voltage waveforms of common nodes of amplifying entities 108*a* through 108*d*, which may typically be connected to dc ground through wire bonds not depicted in the various figures, are depicted in 606 of voltage waveform 600*a*.

Voltage waveform 600*b* represents a time-domain voltage typical of a fast-power ramp from low power to high power in accordance with a "bottom" power control configuration, such as in DAT 400. Waveforms for the voltage at nodes 116*a* through 116*d* of amplifying entities 106*a* through 106*d* and its dc voltage are depicted by 606 and 607, respectively, in waveform 600*b*. Waveforms for the voltage at nodes 114*a* through 114*d* of amplifying entities 108*a* through 108*d* of DAT 400 and its dc voltage are depicted by 602 and 608, respectively, in waveform 600*b*. The dc voltage drop across the power control actuation circuits is the difference between 607 and dc ground.

Voltage waveform 600*c* represents a time-domain voltage typical of a fast power ramp from low power to high power in accordance with a "top & bottom" power control configuration such as implemented in DAT 500. Waveforms for the voltages at nodes 114*a* through 114*d* of amplifying entities 106*a* through 106*d* and its dc voltage are depicted by 602 and 607, respectively, in waveform 600*c*. Waveforms for the voltage at nodes 116*a* through 116*d* of amplifying entities 108*a* through 108*d* of DAT 400 and its dc voltage are depicted by 606 and 610, respectively, in waveform 600*c*. The dc voltage drop across power control actuation circuits 110*a* through 110*d* is the difference between 607 and the supply voltage 608, while the dc voltage drop across power control actuation circuits 112*a* through 112*d* is the difference between 610 and dc ground.

As can be seen in FIGS. 6*a* through 6*c*, the voltage drop across power control actuation circuits 110*a* through 110*d* and 112*a* through 112*d* in waveforms for 600*c* can each be half that of power control actuation circuits 110*a* through 110*d* in waveforms 600*a* and 600*b* for any given power level. Thus it can be seen that "top & bottom" power control in DAT 500 can result in less voltage stress on power control actuation circuits 110*a* through 110*d* and 112*a* through 112*d* as compared to either of the use of top power control actuation circuits 110*a* through 110*d* in DAT 100, or of bottom power control actuation circuits 110*a* through 110*d* in DAT 400. Decreasing the voltage stress applied to the power control actuation circuits of DAT 500 improves the resistance to breakdown and other reliability factors. Alternately, "top & bottom" power control actuation circuits can be implemented with single pass transistors for power control actuation circuits 110*a* through 110*d* and 112*a* through 112*d* in designs which might require stacked pass transistors if "top" or "bottom" power controls were implemented.

Figure 7:
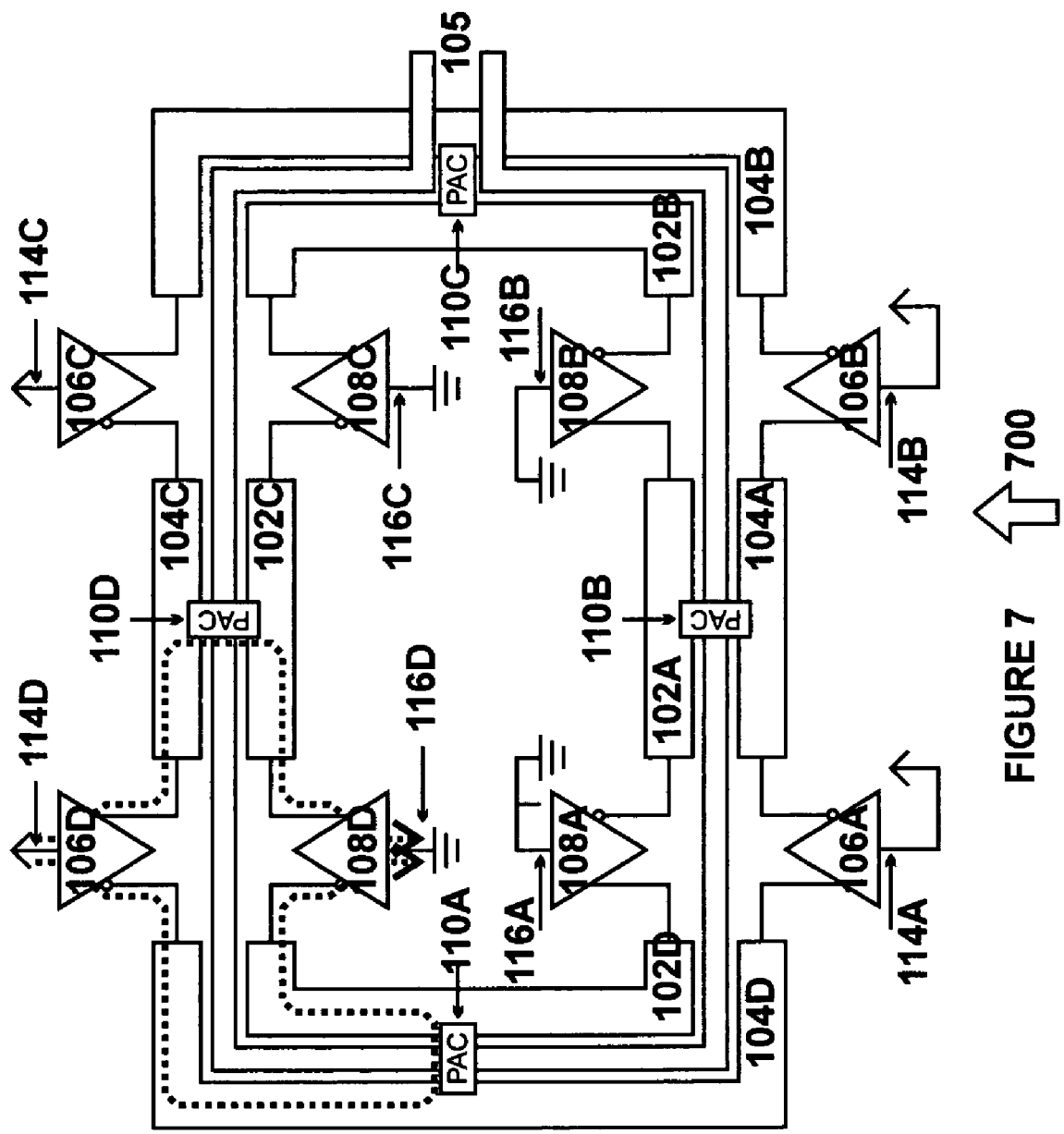
FIG. 7 is a diagram of DAT in accordance with an exemplary embodiment of the present invention.

FIG. 7 is a diagram of DAT 700 in accordance with an exemplary embodiment of the present invention. DAT 700 is shown with inner primary winding 102 and outer primary winding 104, which are driven by amplifying entities 108*a* through 108*d* and 106*a* through 106*d*, respectively, to provide power output to the secondary winding 105. Amplifying entities 106*a* through 106*d* and 108*a* through 108*d* are configured so that their dc current paths are in series. The dc current path between amplifying entities 106*a* through 106*d* and 108*a* through 108*d* is made through the DAT slab inductors and through power control actuation circuits 110*a* through 110*d* configured to conduct controlled current between the inductive slabs of inner primary winding 102 and outer primary winding 104. Such a dc current path is depicted by the dashed lines depicting a current path through amplifying entities 106*d* and 108*d*. Power control actuation circuits 110*a* through 110*d* can control the output power delivered to the secondary winding 105 such as by controlling the current through them, by controlling the voltage on their terminals, or by other appropriate methods. Generally, reduction in output power will be accompanied by increased amounts of dc voltage dropped across power control actuation circuits 110*a* through 110*d* and a corresponding decrease in the dc voltage across amplifying entities 106*a* through 106*d* and 108*a* through 108*d*.

DAT 700 allows power control actuation circuits 110*a* through 110*d* to be placed at the virtual ground points in the ac path, which can reduce the ac current conducted through power control actuation circuits 110*a* through 110*d*, reducing the conduction loss through these circuits. Additionally, this placement at the virtual ground can allow the ac voltage ripple relative to the substrate to be reduced, which can reduce the ac loss to the substrate, and can improve the voltage breakdown performance by decreasing the voltage stress on power control actuation circuits 110*a* through 110*d*, such as the stress relative to the substrate.

DAT 700 further has the advantage of allowing amplifying entities 106*a* through 106*d* and 108*a* through 108*d* to each have simple bias circuits suitable to provide appropriate bias at all power levels. In this embodiment, amplifying entities 106*a* through 106*d* can be implemented so as to require only bias points which are negative relative to their common terminals connected to the supply, such as if these amplifying entities are implemented using PMOS devices. Similarly, amplifying entities 108*a* through 108*d* can be implemented so as to require only bias points which are positive relative to their common terminals connected to ground, such as if these amplifying entities are implemented using NMOS devices. In this way, each of the amplifying entities 106*a* through 106*d* and 108*a* through 108*d* can generate bias voltages up to the supply voltage at all power levels. For instance, amplifying entities 106*a* through 106*d* can have bias levels generated with dc levels as low as ground even though their dc voltages between the supply and outer primary winding 104 can be nearly zero, such as when the output power is low.

Figure 8:
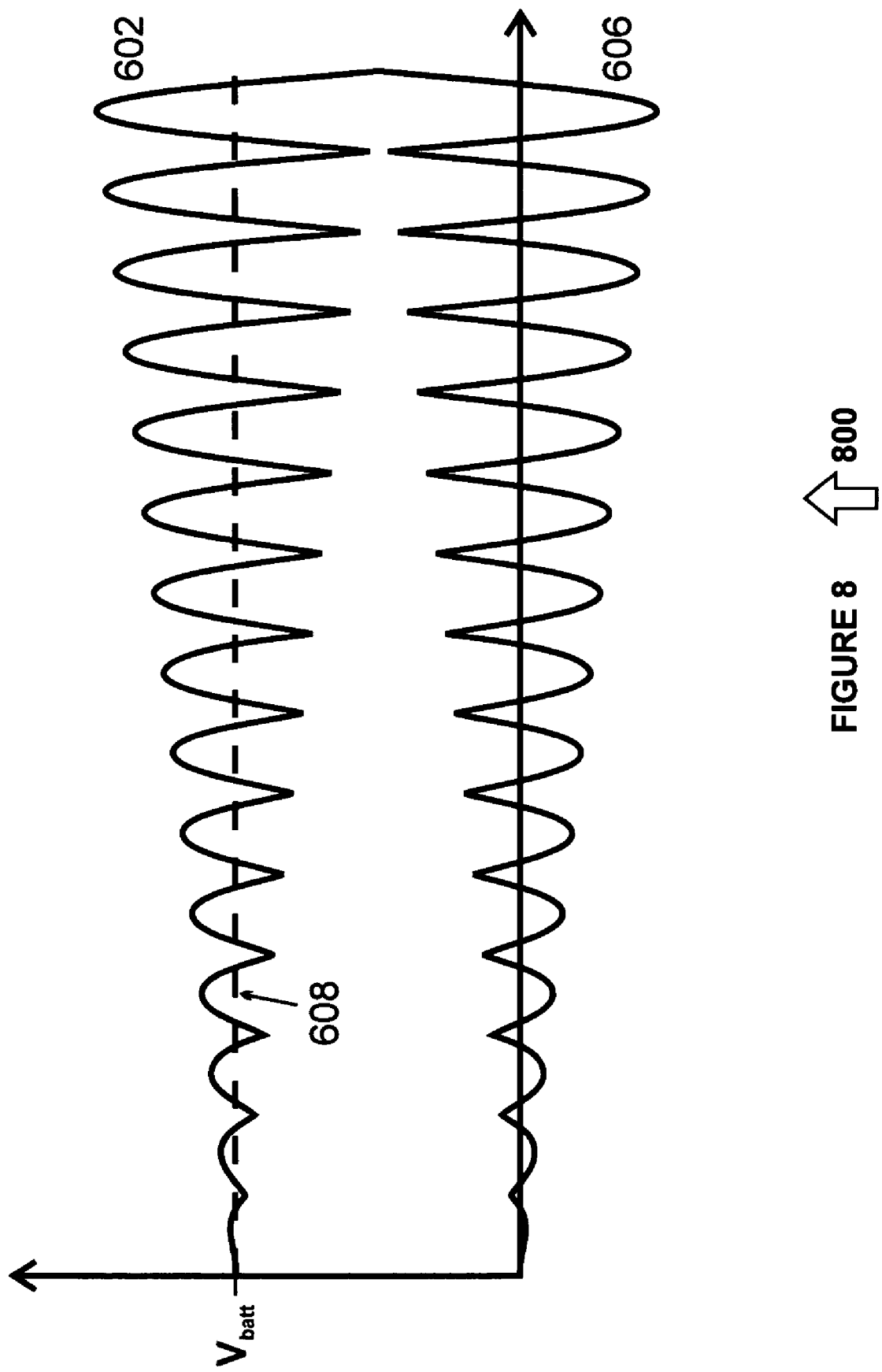
FIG. 8 depicts a representative voltage waveform in accordance with an exemplary embodiment of the present invention.

FIG. 8 depicts a representative voltage waveform 800 in accordance with an exemplary embodiment of the present invention. Voltage waveform 800 represents a time-domain voltage typical of a fast power ramp from low power to high power in accordance with a power control configuration such as implemented in DAT 700. Waveforms for the common nodes of amplifying entities 106*a* through 106*d* and its dc voltage, which is the supply voltage, are depicted by 602 and 608 respectively in the waveforms 800. Waveforms for the common nodes of amplifying entities 108*a* through 108*d* of DAT 400 are depicted by 606. The ac ripple on each of the common points is typically caused by inductance, such as bond wires, which may be in the conductive path between the amplifying entities common points and the supply and ground voltages.

Figure 9:
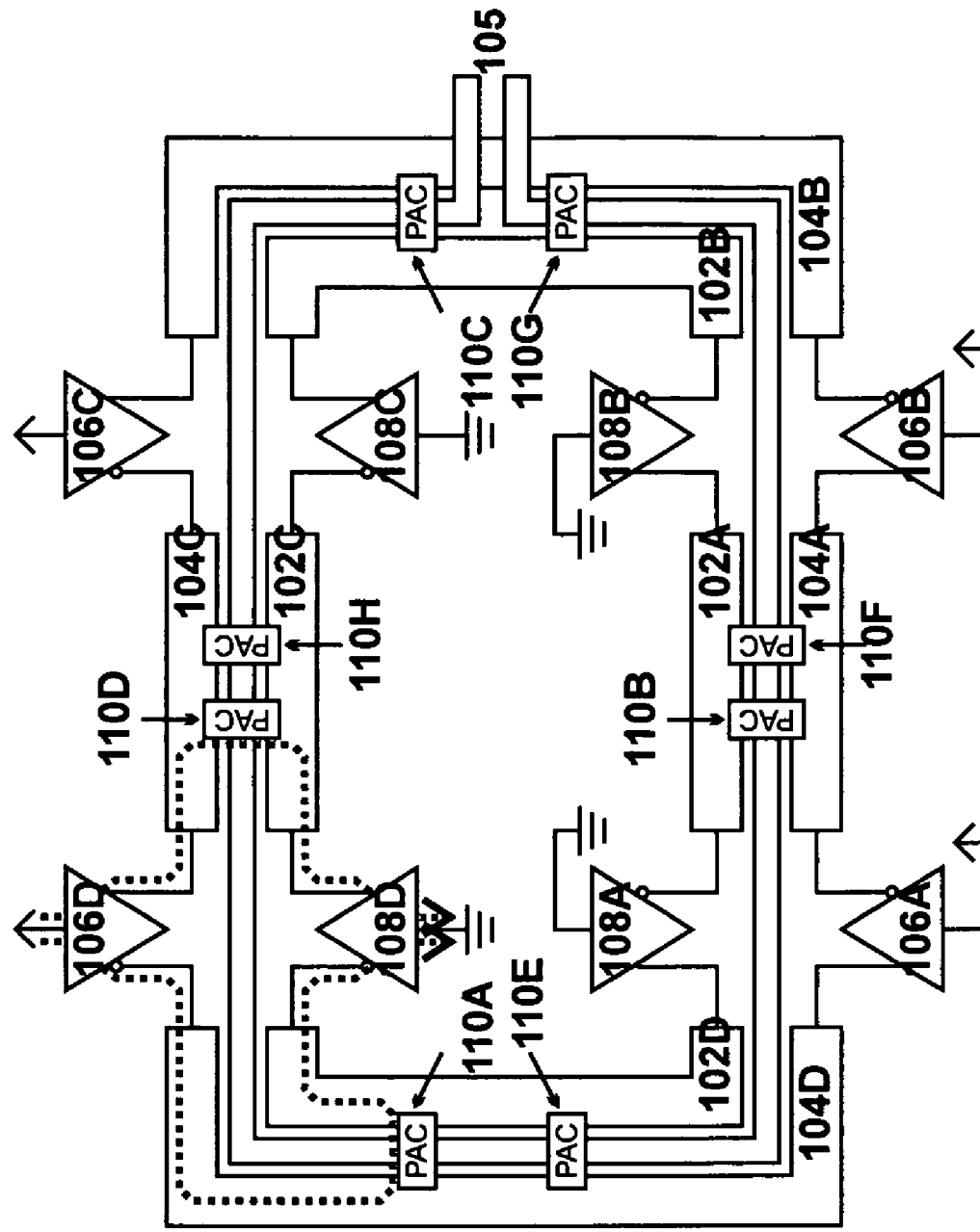
FIG. 9 is a diagram of a DAT with dual power control actuation circuits in accordance with an exemplary embodiment of the present invention.

FIG. 9 is a diagram of a DAT 900 with dual power control actuation circuits in accordance with an exemplary embodiment of the present invention. Amplifying entities 106a through 106d and 108a through 108d are configured so that their dc current paths are in series. The dc current path between amplifying entities 106a through 106d and 108a through 108d is made through the DAT slab inductors and through power control actuation circuits 110a through 110h, which are configured to conduct controlled current between the inductive slabs of inner primary winding 102 and outer primary winding 104. These power control actuation circuits are placed such that each of the slab inductors of inner primary winding 102 is connected to the adjacent slab of outer primary winding 104 through multiple power control actuation circuits. An exemplary dc current path is depicted by the dashed lines through amplifying entities 106d and 108d.

In one embodiment, power control actuation circuits 110a through 110h can be placed at points near to and symmetrical with respect to the virtual ground points on inner primary winding 102 and outer primary winding 104. This placement of the components near to the virtual ground can reduce the ac current through power control elements 110a through 110h, can reduce the ac loss in the substrate, and can improve the voltage breakdown performance by decreasing the voltage stress on power control actuation circuits 110a through 110h. Having power control actuation circuits 110a through 110h split into multiple sections rather than a single element at the virtual ground can allow more flexibility in layout, such as if other circuitry must also be placed near to the virtual ground points. Furthermore, the dc losses can be reduced due to the shorter path that the dc current takes through inner primary winding 102 and outer primary winding 104 since the power control actuation circuits can now be closer to amplifying entities 106a through 106d and 108a through 108d.

Figure 10:
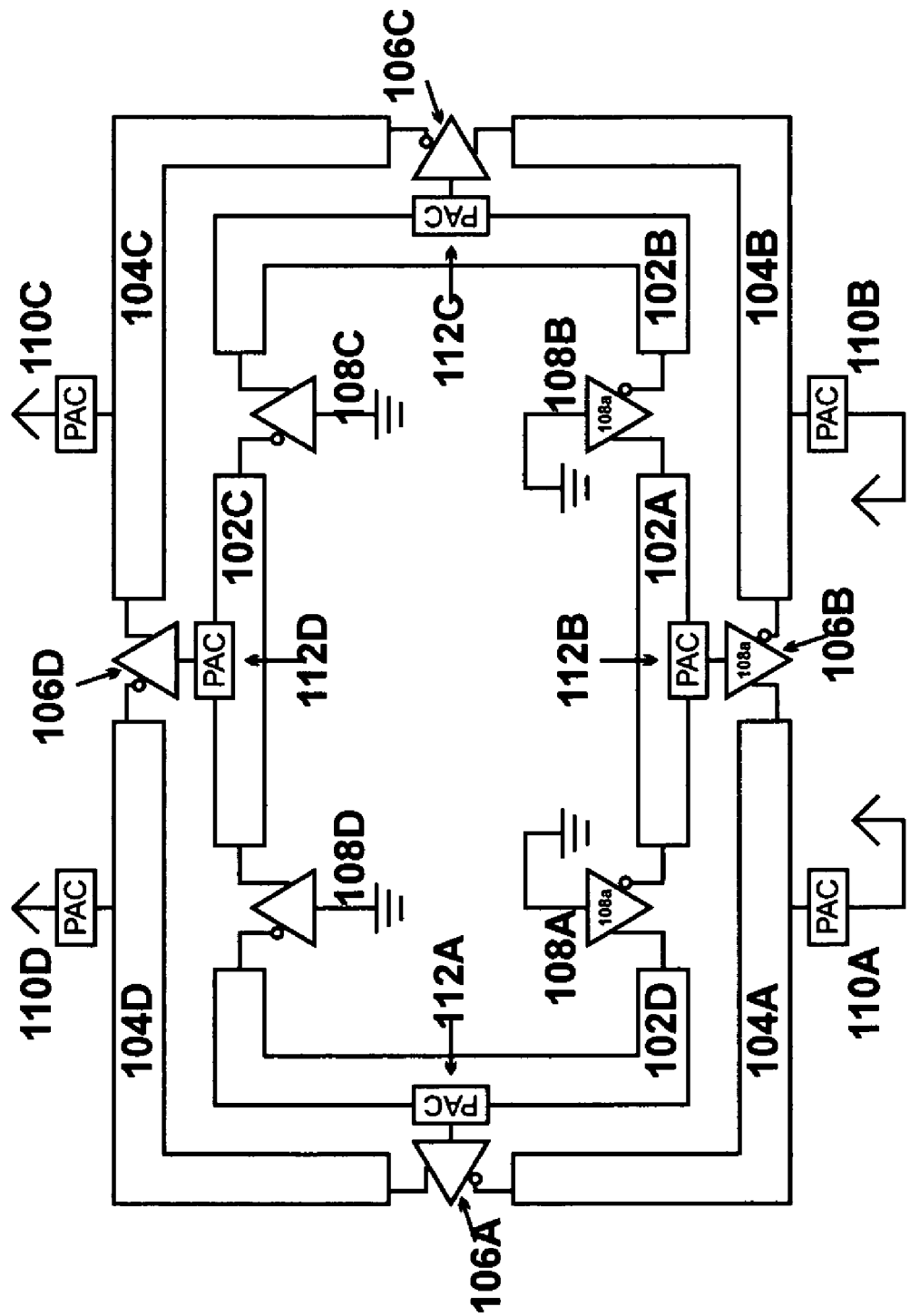
FIG. 10 is a diagram of a DAT in accordance with an exemplary embodiment of the present invention.

FIG. 10 is a diagram of a DAT 1000 in accordance with an exemplary embodiment of the present invention. Exemplary DAT 1000 is depicted with inner primary winding 102 and outer primary winding 104, which are driven by amplifying entities 108a through 108d and 106a through 106d, respectively, to provide power output to a secondary, which for reasons of clarity, has been omitted from the figure.

In this configuration, amplifying entities 106a through 106d and 108a through 108d are configured to drive their respective primaries in parallel at ac while at the same time being in series with one another with respect to the supply voltage. This is accomplished by connecting the common points of amplifying entities 106a through 106d at or near the virtual grounds of the each slab inductor on inner primary winding 102, which can reduce the interaction between amplifying entities 108a through 108d and 106a through 106d through this connection compared to making this connection at other locations, potentially reducing the interaction to nearly zero. The result is that amplifying entities 106a through 106d and 108a through 108d each drive their respective primaries while sharing the dc current such that they are in series with respect to the dc supply. DAT 1000 allows amplifying entities 106a through 106d and 108a through 108d to operate together from a higher supply voltage than either of the two is capable of operating from individually.

As DAT 1000 utilizes amplifying entities which have common nodes that are at lower dc potential than their output nodes, DAT 1000 can have the benefit of utilizing amplifying entities comprised of NMOS devices, as opposed to having some NMOS devices and some PMOS devices. DAT 1000 can result in higher efficiency and higher possible operating frequency due to the typically advantageous properties of NMOS devices over PMOS devices in a given manufacturing process. Furthermore, DAT 1000 exhibits reduced substrate loss, improved voltage breakdown characteristics, and improved operating efficiency.

In one embodiment, power control actuation circuits 110a through 110d and 112a through 112d are configured so that each drops similar dc voltage as the other at any given output power level. This can have the benefit of allowing amplifying entities 106a through 106d and 108a through 108d to each have simple bias circuits suitable to provide appropriate bias at all power levels. In this embodiment, amplifying entities 106a through 106d are implemented so as to require only bias points which are positive relative to their common terminals connected to nodes 114a through 114d, such as if these amplifying entities are implemented using NMOS devices. Similarly, amplifying entities 108a through 108d are implemented so as to require only bias points which are positive relative to their common terminals connected to nodes 116a through 116d, such as if these amplifying entities are implemented using NMOS devices. Furthermore, amplifying entities 106a through 106d and 108a through 108d are configured to each drop nearly the same dc voltage for any given dc supply current. In this way, amplifying entities 106a through 106d and 108a through 108d can each generate bias voltages up to half the supply voltage at all power levels. This can be readily seen by noting that the common points of amplifying entities 106a through 106d will be held at close to half the supply voltage independent of power level, so that voltages up to nearly half the supply voltage above that common node can be readily generated from the available supply voltage.

Figure 11B:
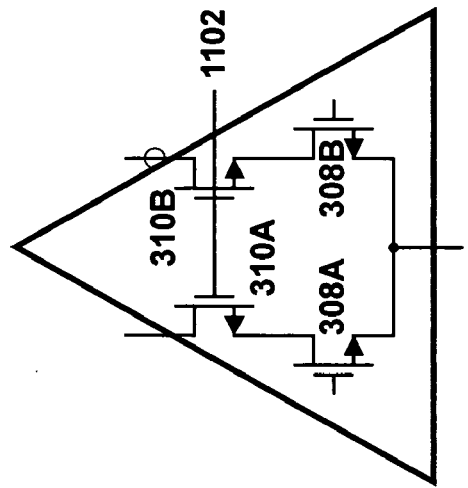
FIG. 11b is a diagram of an N-channel amplifying entity in accordance with an exemplary embodiment of the present invention.
Figure 11C:
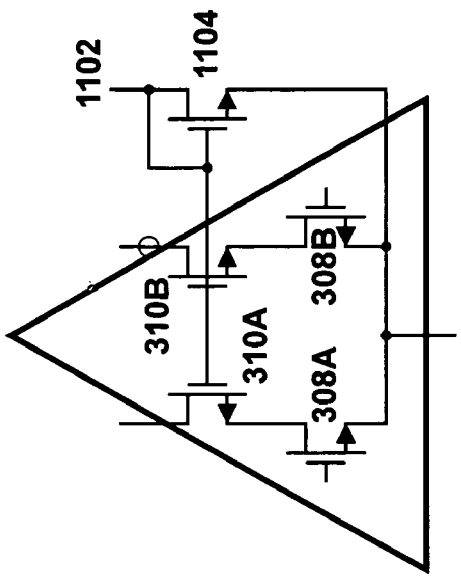
FIG. 11c is a diagram of an N-channel amplifying entity with improved control linearity in accordance with an exemplary embodiment of the present invention.
Figure 11A:
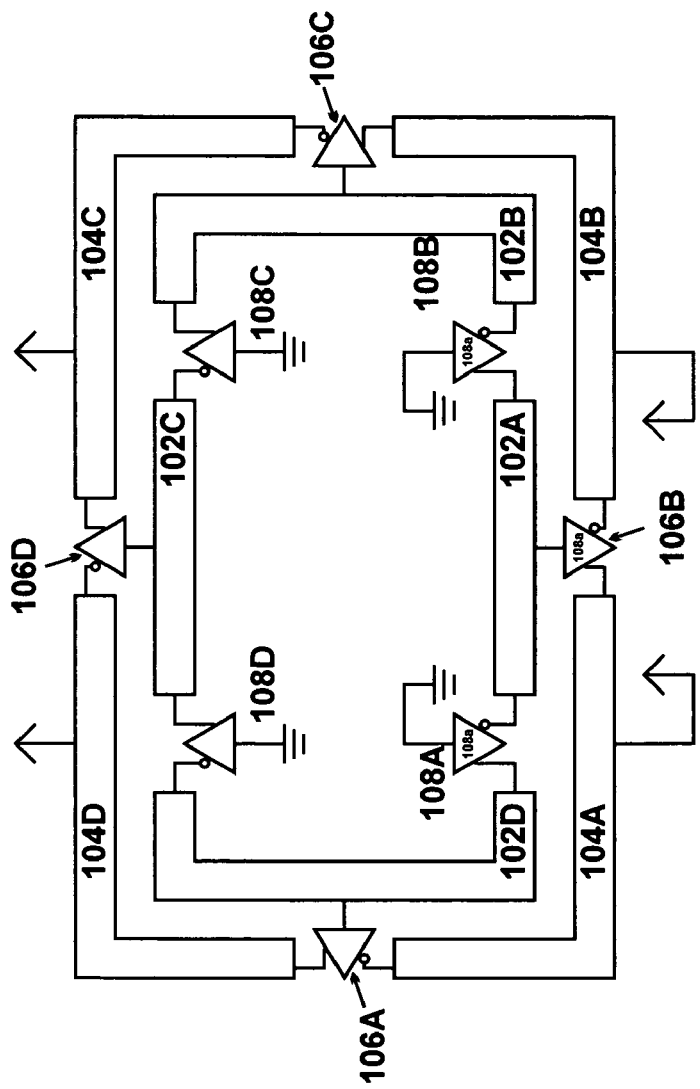
FIG. 11a is a diagram of DAT, in which the power control function is performed by cascode transistors inside the amplifying entities in accordance with an exemplary embodiment of the present invention.

FIG. 11a is a diagram of DAT 1100, in which the power control function is performed by cascode transistors inside the amplifying entities 106a through 106d and 108a through 108d in accordance with an exemplary embodiment of the present invention. Instead of using separate power control actuation circuits, cascode transistors can be used to control the power amplifier's output power level and to accommodate a large supply voltage. Relative to power control architectures utilizing separate power control elements, the use of cascode transistors as a power control element can reduce both dc loss and substrate loss of the power control actuation circuits and further improve the performance of a DAT, particularly if the cascode transistors are required for some additional reason such as breakdown.

Although a DAT configuration similar to that of DAT 1000 in FIG. 10 has been depicted in the figure, the use of amplifying entities with internal cascode power control function can be similarly utilized for other DAT configurations, such as DAT 700 in FIG. 7. In addition to the advantages noted for DAT 1000, DAT 1100 does not require additional circuitry in the dc supply paths of the amplifying entities in order to implement the power control function beyond the cascode transistors which may typically already be implemented as part of the amplifying entities.

FIG. 11b is a diagram of an N-channel amplifying entity 1100b in accordance with an exemplary embodiment of the present invention. Transistors 308 are amplifying entities that may also be used as switches, and transistors 310 are cascode devices placed between transistors 308 and the outputs, which can act as power control elements. The output power generated by the amplifying entity for a given dc voltage can be controlled by adjusting the gate voltage 1102 to an appropriate level. For example, when NMOS devices are used, reduction in the dc gate voltage 1102 typically results in reduced output power due to reduction in the voltage across amplifying devices 308, reduced gate-source voltage on cascode devices 310, or combinations of the two effects. If appropriate limitations are made on the voltage 1102, such as to keep it below an acceptable level, the cascode transistors 310 can also have the advantage of reducing the voltage imposed upon the amplifying devices 308 which can allow improvements in robustness against voltage breakdown in these devices.

FIG. 11c is a diagram of an N-channel amplifying entity 1100c with improved control linearity in accordance with an exemplary embodiment of the present invention. Transistors 308 are amplifying devices, which may be used as switches, and are connected to a common node. Transistors 310 are cascode power control devices, which may optionally also be used for breakdown protection elements.

The gate voltage of transistors 308 and 310, which can control the output power of the amplifying entity, is generated by control current 1102 which is driven through the diode-connected device 1104 which can be optionally made to match cascode devices 310 except for an optional scaling factor. This arrangement can have the benefit of increasing the linearity between control signal and ac output signal level. For instance, the dc gate voltage of transistors 310 and the output signal levels, such as voltage and current, can typically have a square law relationship between them. By placing diode connected device 1104, which can have the inverse relationship between control current 1102 and the gate voltage, the relationship between control current and output signal can be-made more linear.

Figure 12:
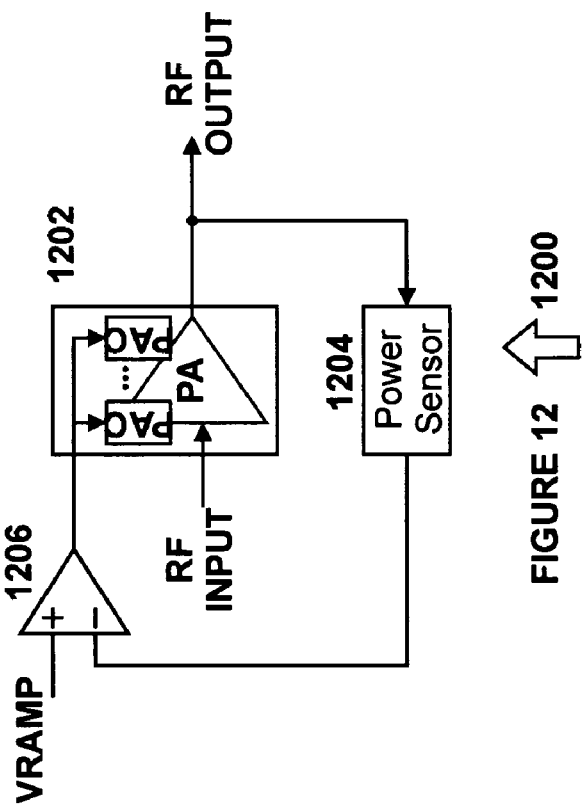
FIG. 12 is a diagram of a power control feedback loop in accordance with an exemplary embodiment of the present invention.

FIG. 12 is a diagram of a power control feedback loop 1200 in accordance with an exemplary embodiment of the present invention. The output of power amplifier 1202 is detected by a power sensor 1204. The measured results are fed back to the error amplifier 1206, which compares the output to a reference signal Vramp, which represents the desired output level. The amplified error signal is used to adjust the output power of RF output using power control actuation circuits, or by other suitable methods such as changing cascode bias points. In power amplifier 1202 there are one or more actuator circuits, or suitable circuitry to accomplish their function which are depicted as "PAC" in 1202, by which power amplifier output power can be changed. This power control loop can be used in conjunction with DAT 100, DAT 400, DAT 500, DAT 700, DAT 900, DAT 1000, DAT 1100, other DAT amplifiers or other suitable amplifiers.

Figure 13:
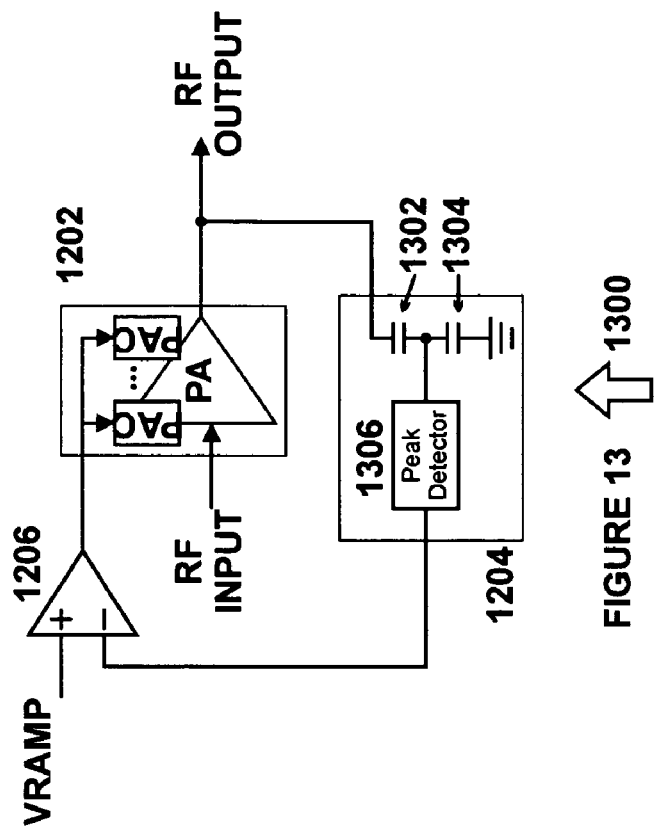
FIG. 13 is a diagram of a power control actuation circuit in accordance with an exemplary embodiment of the present invention.

FIG. 13 is a diagram of a power control actuation circuit 1300 in accordance with an exemplary embodiment of the present invention. In this implementation, power sensor 1204 is implemented using a capacitive voltage divider composed of capacitors 1302 and 1304 followed by peak detector 1306, which can output a signal related the peak voltage of its ac input. This detection method can have the advantage of high accuracy if the power amplifier load impedance is accurately known. This is because the detected level is dependent on the ratio of capacitors 1302 and 1304, the ability of the peak detector to accurately report sense the peak voltage, and an accurate dc voltage level to compare the peak detector output against. Since in many cases these three components can be controlled very accurately across manufacturing variables such as process, temperature, and supply voltage, the loop can accurately detect the output ac voltage swing of the power amplifier.

Figure 14:
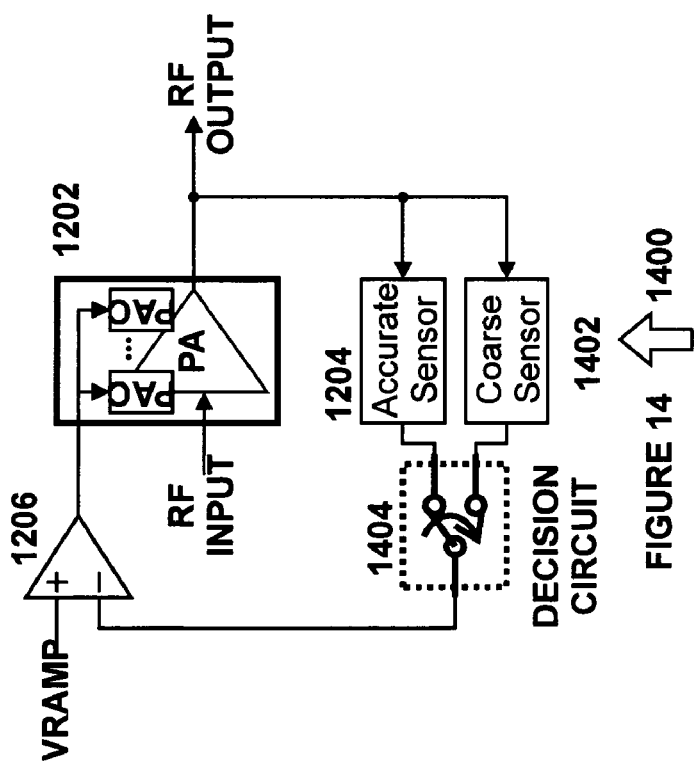
FIG. 14 is a diagram of a power control actuation circuit with a dual feedback loop in accordance with an exemplary embodiment of the present invention.

FIG. 14 is a diagram of a power control actuation circuit 1400 with a dual feedback loop in accordance with an exemplary embodiment of the present invention. In this circuit, power sensor 1204 has been augmented with coarse power sensor 1402. Power sensor 1204 is a sensor which can accurately detect power level when the output power is high, but which may have poor capabilities to accurately detect the power when the power amplifier output is low. Coarse power sensor 1402 is a sensor which can detect power levels over a wider range than 1204 but can have less accuracy at high power levels. Decision circuit 1404 is used to multiplex or otherwise combine the outputs of the two power sensors to the input of the error amplifier 1206.

When output power level is low, the output of power amplifier 1202 detected by coarse sensor 1402 is selected by decision circuit 1404. The measured results are fed back to the error amplifier 1206. After comparing the output to a reference signal that represents the required output power Vramp, the amplified error signal is used to adjust the output power RF Output. When output power level is high, the output of power amplifier 1202 detected by power sensor 1204 is selected by decision circuit 1404, The measured results are fed back to the error amplifier 1206. After comparing the output to a reference signal that represents the required output power Vramp, the amplified error signal is used to adjust the output power RF output. Power amplifier 1202 includes actuator circuitry depicted as PAC in 1202, by which power amplifier output power can be changed.

This method of power control has the advantage of being able to control the power level accurately at high power without the requirement to make an accurate power sensor which is capable of operating over the entire power control range. By using two sensors, one with accuracy but limited range while the other has wide range and limited accuracy, the design requirements of the power control can be simplified relative to using a single power sensor which might require wide range and high accuracy simultaneously.

In one embodiment, the decision circuit can be a multiplexing switch so that only one of the outputs of power sensor 1204 and coarse power sensor 1402 is used at any given time. An alternative is to use a "soft switch" that can have a range of levels where power sensor 1204 and coarse power sensor 1402 have their power estimates averaged with each other. By appropriately varying the weights of the averaging function to favor power sensor 1204 at higher power levels while favoring coarse power sensor 1402 at lower ones, the effect of any discontinuity when switching between the two sensors can be reduced.

Figure 15:
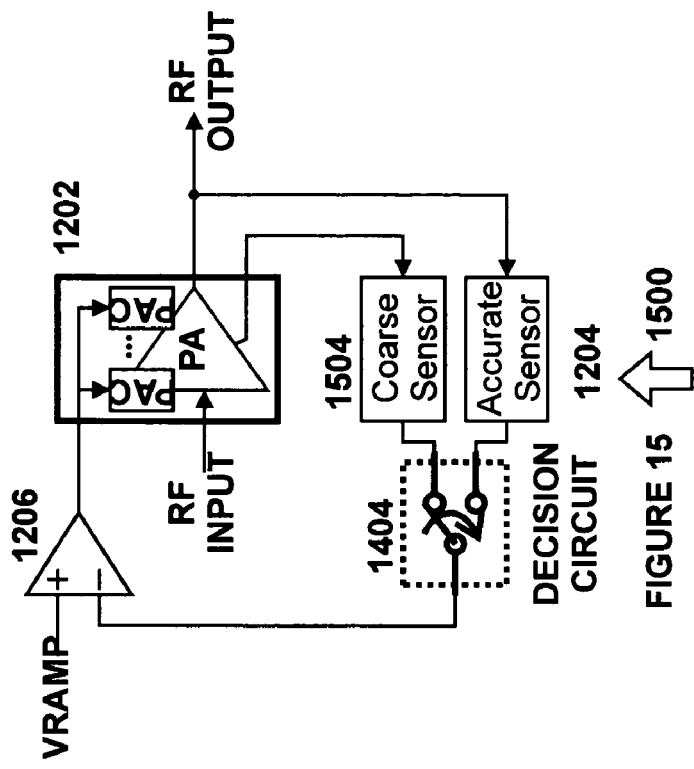
FIG. 15 is a diagram of a power control actuation circuit 1500 with a dual feedback loop with second sensor measuring an internal power amplifier operating conditions, such as a voltage or current inside the power amplifier, in accordance with an exemplary embodiment of the present invention.

FIG. 15 is a diagram of a power control actuation circuit 1500 with a dual feedback loop 1500 with a second sensor measuring internal power amplifier operating conditions, such as a voltage or current inside the power amplifier, in accordance with an exemplary embodiment of the present invention.

When output power level is low, coarse sensor 1504 is used to estimate the power amplifier output power by measuring an internal power amplifier operating condition which can be dc current, peak current, dc voltage, peak voltage or some other suitable condition which can be used to give an indication of the output power.

In one exemplary embodiment, coarse sensor 1504 can monitor the dc voltage across the amplifying devices, such as the voltages of nodes 114a through 114d in DAT 100. Since in saturated amplifiers the relationship between the dc voltage imposed across the amplifying devices is nearly linear with the output signal, this dc level can be used to estimate the output power if the approximate coefficient of linearity is known, such as by using simulation or measurement data. Alternately, the dc current through the amplifying devices could be used due to the similar relationships between dc current taken by the amplifying devices and the output level. Other indications such as the peak ac voltage on the amplifying entities outputs could also be used.

Similar to power control actuation circuit 1400, the use of multiple power sensors 1204 and 1504 allows the entire output power range to be covered while achieving the required accuracy at high power levels. The use of coarse sensor 1504 can bring further advantages such as higher accuracy and easier implementation.

Figure 16:
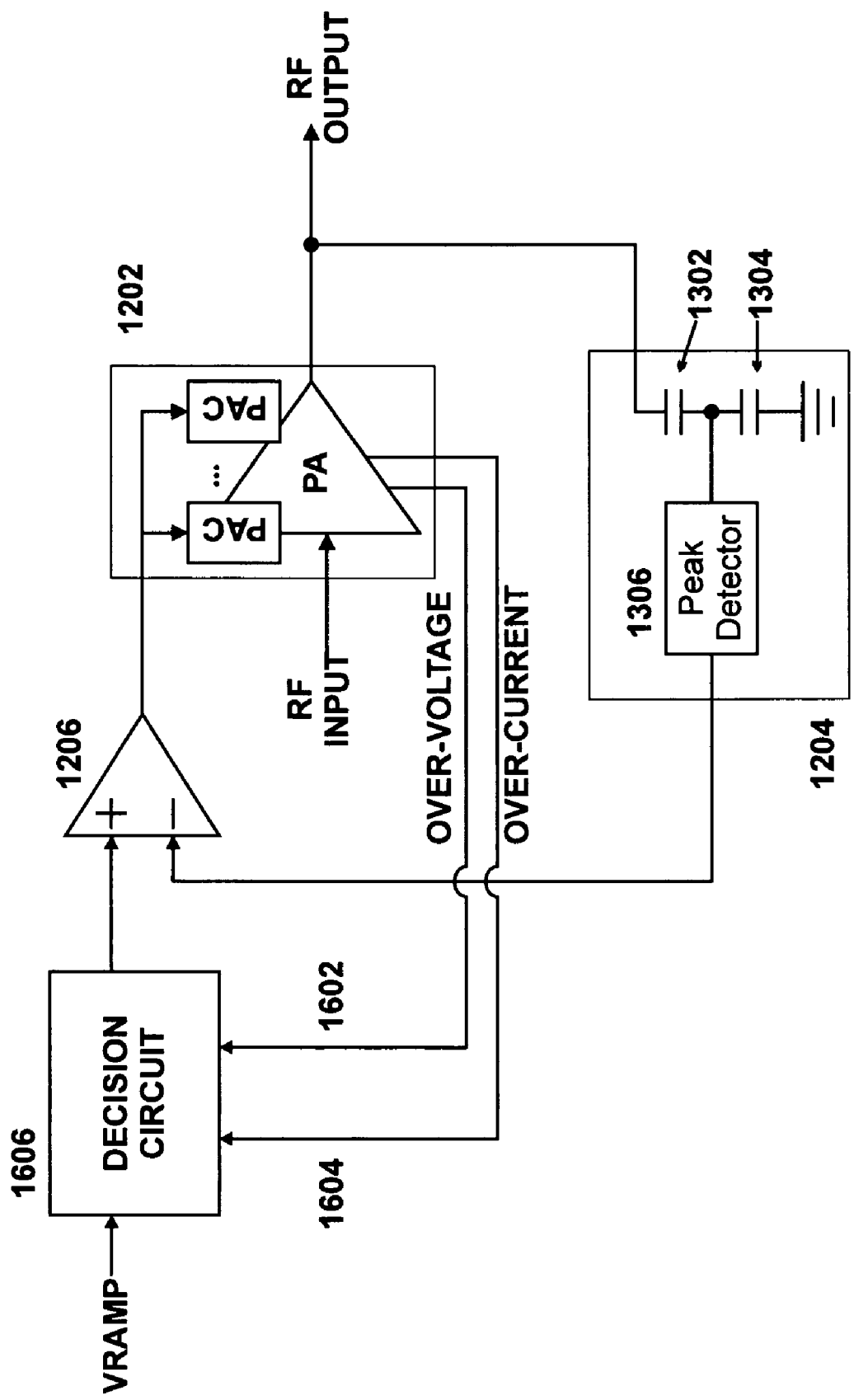
FIG. 16 is a diagram of VSWR protection circuit in accordance with an exemplary embodiment of the present invention.

FIG. 16 is a diagram of VSWR protection circuit 1600 in accordance with an exemplary embodiment of the present invention. A VSWR event includes an event where the load of a power amplifier changes its impedance away from the nominal case (typically ~50 ohm), which can be due to some environmental change (e.g. a short circuit at the antenna) or other causes. The power amplifier has to be protected from and survive VSWR events, which can result in substantially higher than nominal stresses on the amplifier such as higher peak voltages and higher currents. In order to protect the amplifier from these stresses, it can be necessary to require rapid detection of a VSWR event or the associated stresses and prompt corrective action.

In this exemplary embodiment, VSWR event detection can be achieved by decision circuit 1606 monitoring indication signals 1604 and 1602, which report the operating power amplifier voltage and current, respectively. These indication signals can report the peak voltage and current seen by the stressed amplifying devices as measured by an appropriate circuit. Alternately, one or both of the voltage and current can be measured as dc levels, which can result in improved ease of implementation at the expense of less robust protection.

Decision circuit 1606 adjusts its output connected to error amplifier 1206 so as to enable the loop to achieve the power requested by the Vramp signal when VSWR indication signals 1602 and 1604 indicate stress levels which are acceptable. In the event that indications 1602 and/or 1604 report stresses which are above a preset threshold, decision circuit 1606 can reduce the requested power until the stress indications report acceptable operating conditions.

In time division multiple access (TDMA) systems such as GSM, the output power required from the power amplifier can be bursts of power with a controlled power ramp up in the beginning of a time slot followed by a period of constant power before ramping power down at the end of the timeslot. In this case, the decision circuit may be configured to pass Vramp through to error amplifier 1206 until the first indication of over-stress from indication signals 1602 and/or 1604 is received, at which point it may hold the output to the error amplifier at the last known good value of Vramp, effectively ignoring the Vramp input signal until either the end of the slot or until the Vramp input is brought lower than some predetermined value, such as the held Vramp value or a level that provides a low-stress condition on the power amplifier. This implementation can simplify the VSWR protection circuit in a TDMA system since the stability of the feedback loops involving signals 1604 and 1602 can be provided by design, such as where the small signal loop gain signals 1604 and 1602 to the power amplifier can be zero both before the VSWR event is detected as well as after a VSWR event is being held.

FIG. 17 is a diagram of VSWR protection circuit 1700 in accordance with an exemplary embodiment of the present invention. In this exemplary embodiment, VSWR event detection can be achieved by the decision circuit 1606 comprised by over-voltage input 1604, over-current input 1602, over-voltage comparator 1706, over-current comparator 1708, combinational logic 1704, Vramp voltage holding capacitor 1702, and passgate 1710.

Voltage and current indication signals 1604 and 1602 are configured to act as analog indications of amplifier voltage and current operating levels, such as peak voltage, peak current, dc voltage, or dc current. These indication signals are provided to comparators 1706 and 1708, which output digital signals indicating whether the indication signal is above or below a preset value corresponding to a VSWR over-event decision. If power amplifier 1202 reaches a stress level corresponding to an indication signal level on voltage and current indication signals 1602 or 1604 which is above the pre-defined threshold value for that signal while output power of the power amplifier is being increased, further increases in the output power is blocked by disconnecting the Vramp signal from the holding capacitor 1702 in the decision circuit 1606 using passgate 1710. After this event occurs, the last known good output power level can be held by capacitor 1702, until the power control 1700 is reset. In order to optionally increase the margin against the VSWR protection circuit resetting itself, potentially resulting it relaxation oscillation in the VSWR protection loop, the comparators 1706 and 1708 can be implemented as Schmidt triggers.

The output of decision circuit 1606 is sent to the error amplifier 1206 as a reference signal. The feedback signal for error amplifier 1206 is obtained by peak detector block 1204 comprised by peak detector 1306 and capacitive attenuator 1302 and 1304 measuring the output peak voltage of power amplifier 1202. The error signal thus obtained is amplified by error amplifier 1206 and used to adjust the output power RF Output of power amplifier 1202 accordingly as described above.

FIG. 18 is a diagram of VSWR protection circuit 1800 with Vramp holding release circuitry in accordance with an exemplary embodiment of the present invention. In this exemplary embodiment, VSWR event detection can be achieved by decision circuit 1606 comprised by over-voltage input 1602, over-current input 1604, over-voltage detection comparator 1708, over-current detection comparator 1706, combinational logic 1704 and 1804, Vramp comparator 1802, dc comparator offset, passgate 1710 and Vramp voltage holding capacitor 1702.

Voltage and current indication signals 1604 and 1604 are configured to, act as analog indications of amplifier voltage and current operating levels, such as peak voltages peak current, dc voltage, or dc current. These indication signals are provided to comparators 1706 and 1708, which output digital signals indicating whether the indication signal is above or below a preset value corresponding to a VSWR over-event decision. If power amplifier 1202 reaches a stress level corresponding to an indication signal level on voltage and current indication signals 1602 or 1604 which is above the pre-defined threshold value for that signal while output power of the power amplifier is being increased, further increases in the output power is blocked by disconnecting the Vramp signal from the holding capacitor 1702 in the decision circuit 1606 using passgate 1710. Before this event occurs, passgate 1710 is closed so that the voltage on the capacitor 1702 is the same as Vramp, and so that the output of comparator 1802 is high due to the offset 1806. Thus, before the occurrence of a detected VSWR event, the passgate 1710 is controlled by comparators 1706 and 1708.

Upon the detection of the VSWR event, passgate 1710 is opened and the last known good output power level can be held by capacitor 1702. This condition is held until the Vramp level is brought below the voltage on holding capacitor 1702 by an amount equal to offset voltage 1806. When this occurs, pass gate 1710 is closed and voltage in holding capacitor 1702 again tracks the Vramp voltage unless another VSWR event is detected.

The output of decision circuit 1606 is sent to error amplifier 1206 as a reference signal. The feedback signal for error amplifier 1206 is obtained by peak detector block 1204 comprised by peak detector 1306, capacitive attenuator 1302 and 1304 measuring the output peak voltage of power amplifier 1202. The error signal thus obtained is amplified by error amplifier 1206 and used to adjust the output power RF Output of power amplifier 1202 accordingly as described above.

This exemplary embodiment can present further advantage by allowing the output power ramp-down at the end of the timeslot to be controlled by the Vramp voltage once the Vramp voltage is known to be lower than one which would cause a VSWR event. Abrupt or uncontrolled power shut down may cause undesirable behavior such as spectral spreading, time-mask issues such as transmitting power higher than allowed at a given time in the timeslot, breakdown of some circuitry, and power shutdown characteristics out of application specification.

Figure 19:
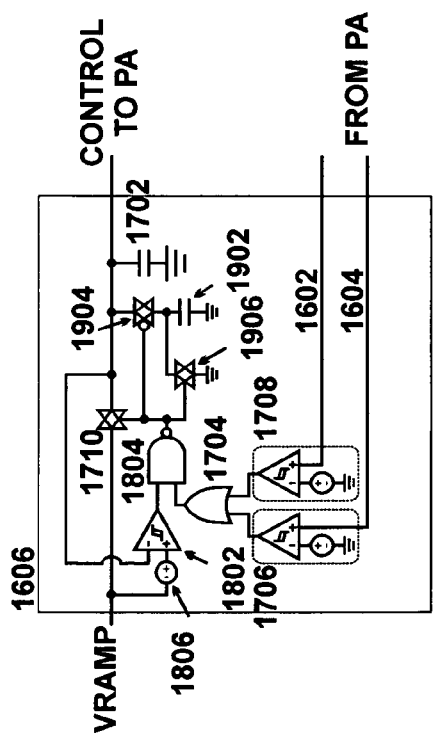
FIG. 19 is a diagram of decision circuit with power back off in accordance with an exemplary embodiment of the present invention.

FIG. 19 is a diagram of decision circuit 1900 with power back off in accordance with an exemplary embodiment of the present invention. In this exemplary embodiment, the decision circuit 1606 of VSWR protection circuit 1800 has been augmented with additional passgates 1904 and 1906 as well as additional capacitor 1902. These additional elements allow the held power after a VSWR event is detected to be reduced in a controlled manner to provide extra margin against over-stress conditions. Before a VSWR event is detected, passgate 1906 is shorted, discharging capacitor 1902 to ground. Passgate 1904 during this time is open so that the voltage on capacitor 1702 tracks Vramp. Upon detection of an event, passgates 1710 and 1906 open while passgate 1904 closes. This connects capacitor 1902 in parallel with capacitor 1702, causing a portion of the charge in capacitor 1702 to transfer to capacitor 1902, reducing the voltage on capacitor 1702 which controls the requested power amplifier output level. This has the effect of holding a power level which is less than the power level at which the detection comparators 1706 or 1708 triggered on by an amount which is determined by the relative sizes of capacitors 1702 and 1902. The hysteresis of comparators 1706 and 1708 should be large enough that this reduction in power level does not result in a change in the output state of comparators 1706 and 1708, or relaxation oscillation might occur. Decision circuit 1900 can thus back off the output power of the power amplifier during a VSWR event and provide extra protection against VSWR related problems.

Figure 20:
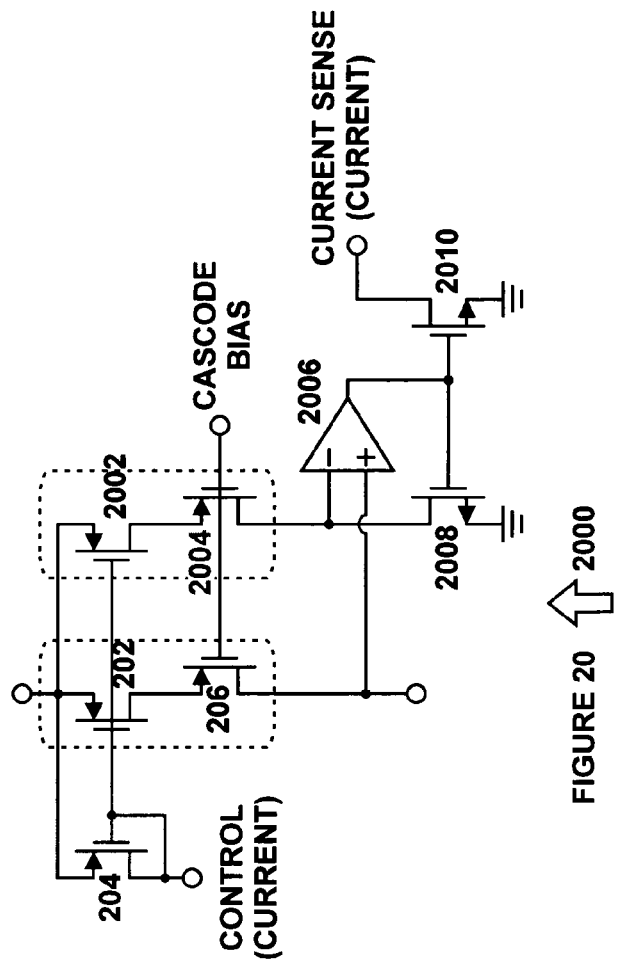
FIG. 20 is a diagram of a power amplifier power control actuation circuit with accompanied dc current detection in accordance with an exemplary embodiment of the present invention.

FIG. 20 is a diagram of a power amplifier power control actuation circuit 2000 with accompanied dc current detection in accordance with an exemplary embodiment of the present invention. Power control actuation circuit 2000 includes pass transistor 2020 with cascode transistor 2060, sense transistor 2002 with cascode transistor 2004, diode-connected transistor 2040, op-amp 2006, and current mirror transistors 2008 and 2010. Pass transistor 2020 can control the current supplied to a power amplifier or subcomponents of a power amplifier, such as the amplifying entities of DAT 100 or other suitable amplifying entities, by changes in its gate voltage. Optional cascode transistor 2060 can be used to improve breakdown voltage or to improve the accuracy of control such as over changes in supply voltage. Optional diode-connected transistor 2040, which can be a transistor identical to pass transistor 2020 except for a scaling factor, can be used to increase the linearity between the input signal passed as a current and the current conducted by the pass transistor into the power amplifier. Alternately, the gate signal of pass transistor 2020 can be controlled directly or through other circuitry.

Sense transistors 2002 and 2004, which can be identical to transistors 2020 and 2060 respectively except for an optional scaling multiple, are configured so that their gate, source, and drain voltages of 2002 and 2004 are held the same as those of 2020 and 2060 respectively. The gate voltages can be made the same by connecting them directly. The drain voltages of 2060 and 2004 can be made the same by using op-amp 2006 which controls the current in transistor 2008 which is conducted through transistors 2002 and 2004. By making transistors 2020 and 2060 identical to transistors 2002 and 2004 respectively except for a scaling factor, the voltages on their drains will be the same by making their currents in the ratio of that scaling factor. Op-amp 2006, then, measures the voltage difference between the drains of transistors 2060 and 2004 and proceeds to regulate the current through transistors 2002, 2004, and 2008 to reduce the voltage difference. If optional cascode transistors 2060 and 2004 are not used, op-amp 2006 could be connected instead to the drains of transistors 2020 and 2002.

By making transistors 2008 and 2010 identical to each other except for a second optional scaling multiple, their currents can be the same. The accuracy of the relationship between the currents in transistor 2008 and 2010 could be further improved by additional means such as by adding cascode devices to these transistors of by using additional feedback to regulate their drain voltages to be the same as each other. By using these circuits, the current drawn by transistor 2010 can be an accurate multiple of the current which the power control actuator is providing to the power amplifier circuit.

This sense current can be used as an indication for a VSWR detection circuit such as those depicted in FIGS. 16 through 19. Alternately or in addition, the sense current could be used as a power sensor for a power control loop such as the coarse sensor 1504 or for other loops including applications which may utilize this sensor as the primary power sensor. Thus, this method of current sensing can present an advantage over other methods as it can detect the current level without the need for additional components such as sense resistors inserted in series with the dc supply current path of the power amplifier, which could consume supply power reducing the efficiency of the power amplifier. Although the implementation depicted in FIG. 20 utilizes PMOS transistors, other suitable transistor types might be used such as NMOS pass transistor devices or other suitable devices.

Although exemplary embodiments of a system and method of the present invention have been described in detail herein, those skilled in the art will also recognize that various substitutions and modifications can be made to the systems and methods without departing from the scope and spirit of the appended claims.

What is claimed is:

1. A distributed active transformer on a semiconducting substrate comprising:
   an outer primary;
   a secondary disposed adjacent to the outer primary;

an inner primary disposed adjacent to the outer primary and the secondary;

a plurality of first amplifiers coupled to the outer primary at a plurality of locations;

a plurality of second amplifiers coupled to the inner primary at a plurality of locations, each second amplifier disposed opposite from and coupled to one of the plurality of first amplifiers; and a plurality of power control actuation circuits, each coupled to one of the first amplifiers and the second amplifiers.

2. The distributed active transformer of claim 1 wherein each of the plurality of power control actuation circuits is coupled between one of the first amplifiers and a voltage source.

3. The distributed active transformer of claim 1 wherein each of the plurality of power control actuation circuits is coupled between one of the second amplifiers and a common voltage.

4. The distributed active transformer of claim 1 wherein each of the plurality of power control actuation circuits is coupled between one of the first amplifiers and one of the second amplifiers, and each of the first amplifiers is coupled to one of the second amplifiers through one of the power control actuation circuits.

5. The distributed active transformer of claim 1 wherein each of the plurality of power control actuation circuits is coupled to the inner primary and the outer primary between one of the first amplifiers and one of the second amplifiers, and each of the first amplifiers is coupled to one of the second amplifiers through one of the power control actuation circuits.

6. The distributed active transformer of claim 1 further comprising:

a second plurality of power control actuation circuits coupled between one of the first amplifiers and a voltage source; and wherein each of the plurality of power control actuation circuits is coupled between one of the second amplifiers and a common voltage.

7. The distributed active transformer of claim 1 wherein the plurality of first amplifiers are each coupled to the outer primary between two slab inductors of the outer primary, the plurality of second amplifiers are each coupled to the inner primary at between two slab inductors of the inner primary, and the plurality of power control actuation circuits further comprises:

a plurality of first power control actuation circuits coupled between the outer primary and a voltage source; and a plurality of second power control actuation circuits coupled between the inner primary and the plurality of first amplifiers.

8. The distributed active transformer of claim 1 wherein one or more of the power control actuation circuits further comprises:

a first sensor having an input coupled to the output of the amplifier associated with the power control actuation circuit and an output;

a second sensor having an input coupled to the output of the amplifier associated with the power control actuation circuit and an output;

a decision circuit coupled to the output of the first sensor and the second sensor, selecting one of the outputs based on a control signal, and providing the selected output at an output of the decision circuit; and an error amplifier generating a control signal for the power control actuation circuit based on the difference between the output of the decision circuit and a reference signal.

9. The distributed active transformer of claim 1 wherein the plurality of power control actuation circuits comprises means for actuating one or more of the first amplifiers and the second amplifiers.

10. A distributed active transformer on a semiconducting substrate comprising:

a primary;

a secondary disposed adjacent to the primary;

a plurality of amplifiers coupled to the primary at a plurality of locations; and a voltage standing wave ratio (VSWR) detector coupled to one of the amplifiers, the VSWR further comprising:

a power amplifier over-voltage indication circuit generating an output;

a power amplifier over-current indication circuit generating an output;

a decision circuit receiving the power amplifier over-voltage indication circuit output and the power amplifier over-current indication circuit output and generating an output based on the power amplifier over-voltage indication circuit output and the power amplifier over-current indication circuit output; and one or more power control actuation circuits receiving the decision circuit output and adjusting a power level of the amplifier.

11. The distributed active transformer of claim 10 wherein the VSWR detector further comprises:

a ramp signal tracking a predetermined power ramp-up signal; and wherein the decision circuit receives the ramp signal and passes the ramp signal based on the power amplifier over-voltage indication circuit output and the power amplifier over-current indication circuit output.

12. The distributed active transformer of claim 10 wherein the VSWR detector further comprises:

a ramp signal tracking a predetermined power ramp-up signal; and an error amplifier receiving the ramp signal and generating the decision circuit output.

13. The distributed active transformer of claim 10 wherein the VSWR detector further comprises:

a ramp signal tracking a predetermined power ramp-up signal;

peak detector circuitry receiving a power amplifier output and generating a peak detection signal; and an error amplifier receiving the ramp signal and the peak detection signal and generating the decision circuit output.

14. A voltage standing wave ratio (VSWR) detector comprising:

a power amplifier over-voltage indication circuit generating an output;

a power amplifier over-current indication circuit generating an output;

a decision circuit receiving the power amplifier over-voltage indication circuit output and the power amplifier over-current indication circuit output and generating an output based on the power amplifier over-voltage indication circuit output and the power amplifier over-current indication circuit output; and one or more power control actuation circuits receiving the decision circuit output and adjusting a power level of a power amplifier.

15. The VSWR detector of claim 14 further comprising:
a ramp signal tracking a predetermined power ramp-up signal; and
wherein the decision circuit receives the ramp signal and passes the ramp signal based on the power amplifier over-voltage indication circuit output and the power amplifier over-current indication circuit output.

16. The VSWR detector of claim 14 further comprising:
a ramp signal tracking a predetermined power ramp-up signal; and
wherein the decision circuit receives the ramp signal and blocks the ramp signal based on the power amplifier over-voltage indication circuit output and the power amplifier over-current indication circuit output.

17. The VSWR detector of claim 14 further comprising:
peak detector circuitry receiving a power amplifier output and generating a peak detection signal; and
an error amplifier receiving the peak detection signal and generating the decision circuit output.

18. The VSWR detector of claim 14 further comprising:
a ramp signal tracking a predetermined power ramp-up signal;
peak detector circuitry receiving a power amplifier output and generating a peak detection signal; and
an error amplifier receiving the ramp signal and the peak detection signal and generating the decision circuit output.

19. The VSWR detector of claim 14 further comprising:
a ramp signal tracking a predetermined power ramp-up signal;
peak detector circuitry receiving a power amplifier output and generating a peak detection signal;
an error amplifier receiving the ramp signal and the peak detection signal and generating the decision circuit output; and
wherein the ramp signal is modified based on the power amplifier over-voltage indication circuit output and the power amplifier over-current indication circuit output.

20. The VSWR detector of claim 14 further comprising:
a ramp signal tracking a predetermined power ramp-up signal;
peak detector circuitry receiving a power amplifier output and generating a peak detection signal;
an error amplifier receiving the ramp signal and the peak detection signal and generating the decision circuit output; and
wherein the ramp signal is blocked based on the power amplifier over-voltage indication circuit output and the power amplifier over-current indication circuit output.

* * * * *

UNITED STATES PATENT AND TRADEMARK OFFICE
CERTIFICATE OF CORRECTION

PATENT NO. : 7,256,573 B2 Page 1 of 1
APPLICATION NO. : 11/095231
DATED : August 14, 2007
INVENTOR(S) : Magoon et al.

It is certified that error appears in the above-identified patent and that said Letters Patent is hereby corrected as shown below:

Title Page, Item (54) and Col. 1, Line 2
In the Title: "Techiques" should be changed to -- Techniques -- .

Signed and Sealed this

Thirteenth Day of November, 2007

JON W. DUDAS
*Director of the United States Patent and Trademark Office*